(12) United States Patent
Lin et al.

(10) Patent No.: US 12,218,077 B2
(45) Date of Patent: Feb. 4, 2025

(54) SEMICONDUCTOR DEVICE PACKAGE

(71) Applicant: Advanced Semiconductor Engineering, Inc., Kaohsiung (TW)

(72) Inventors: Cheng-Nan Lin, Kaohsiung (TW); Ming-Chiang Lee, Kaohsiung (TW); Yung-I Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 378 days.

(21) Appl. No.: 17/705,216

(22) Filed: Mar. 25, 2022

(65) Prior Publication Data

US 2023/0307380 A1   Sep. 28, 2023

(51) Int. Cl.
*H01L 23/00* (2006.01)
*H01L 23/538* (2006.01)
*H01L 25/18* (2023.01)

(52) U.S. Cl.
CPC ........ *H01L 23/562* (2013.01); *H01L 23/5385* (2013.01); *H01L 24/48* (2013.01); *H01L 25/18* (2013.01); *H01L 2224/48145* (2013.01)

(58) Field of Classification Search
CPC ... H01L 23/562; H01L 23/5385; H01L 24/48; H01L 25/18; H01L 2224/48145; H01L 25/0657; H01L 2221/68327; H01L 2221/68359; H01L 2225/0651; H01L 2225/06517; H01L 2225/06548; H01L 23/49811; H01L 23/5383; H01L 23/5384; H01L 25/50; H01L 21/568; H01L 21/6835; H01L 23/3128; H01L 23/49816; H01L 2225/06562
See application file for complete search history.

(56) References Cited

U.S. PATENT DOCUMENTS 11,251,111 B2    2/2022  Kim
2015/0187741 A1*  7/2015  Tung ............... H01L 25/50
                                                 257/737

* cited by examiner

*Primary Examiner* — Elias Ullah
(74) *Attorney, Agent, or Firm* — FOLEY & LARDNER LLP

(57) ABSTRACT

A semiconductor device package is disclosed. The semiconductor device package includes a carrier, a first electronic component disposed on the carrier and a support component disposed on the carrier. The semiconductor device package also includes a second electronic component disposed on the first electronic component and supported by the support component.

16 Claims, 21 Drawing Sheets

SEMICONDUCTOR DEVICE PACKAGE

BACKGROUND

1. Technical Field

The present disclosure generally relates to a semiconductor device package, and in particular, to a semiconductor device package including a carrier and an electronic component on the carrier.

2. Description of the Related Art

Package on Package (PoP) technique can be used to combine discrete packages, and POP assemblies usually consist of two packages, such as a memory device package mounted on top of a logic device package, connected through a substrate or an interposer.

SUMMARY

In some embodiments, a semiconductor device package includes a carrier, a first electronic component disposed on the carrier and a support component disposed on the carrier. The semiconductor device package also includes a second electronic component disposed on the first electronic component and supported by the support component.

In some embodiments, a semiconductor device package includes a first carrier, a first electronic component disposed on the first carrier and a conductive structure disposed on the first carrier. The semiconductor device package also includes a second carrier in contact with the conductive structure and a second electronic component disposed on the second carrier. The semiconductor device package also includes a first conductive element extending along a lateral side of second electronic component and electrically connects the second electronic component to the second carrier.

In some embodiments, a semiconductor device package includes a first electronic component, a second electronic component disposed on the first electronic component and a conductive wire. The conductive wire has a first end electrically connecting the second electronic component and a second end electrically connecting the first electronic component. The semiconductor device package also includes a support component supporting the first end.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
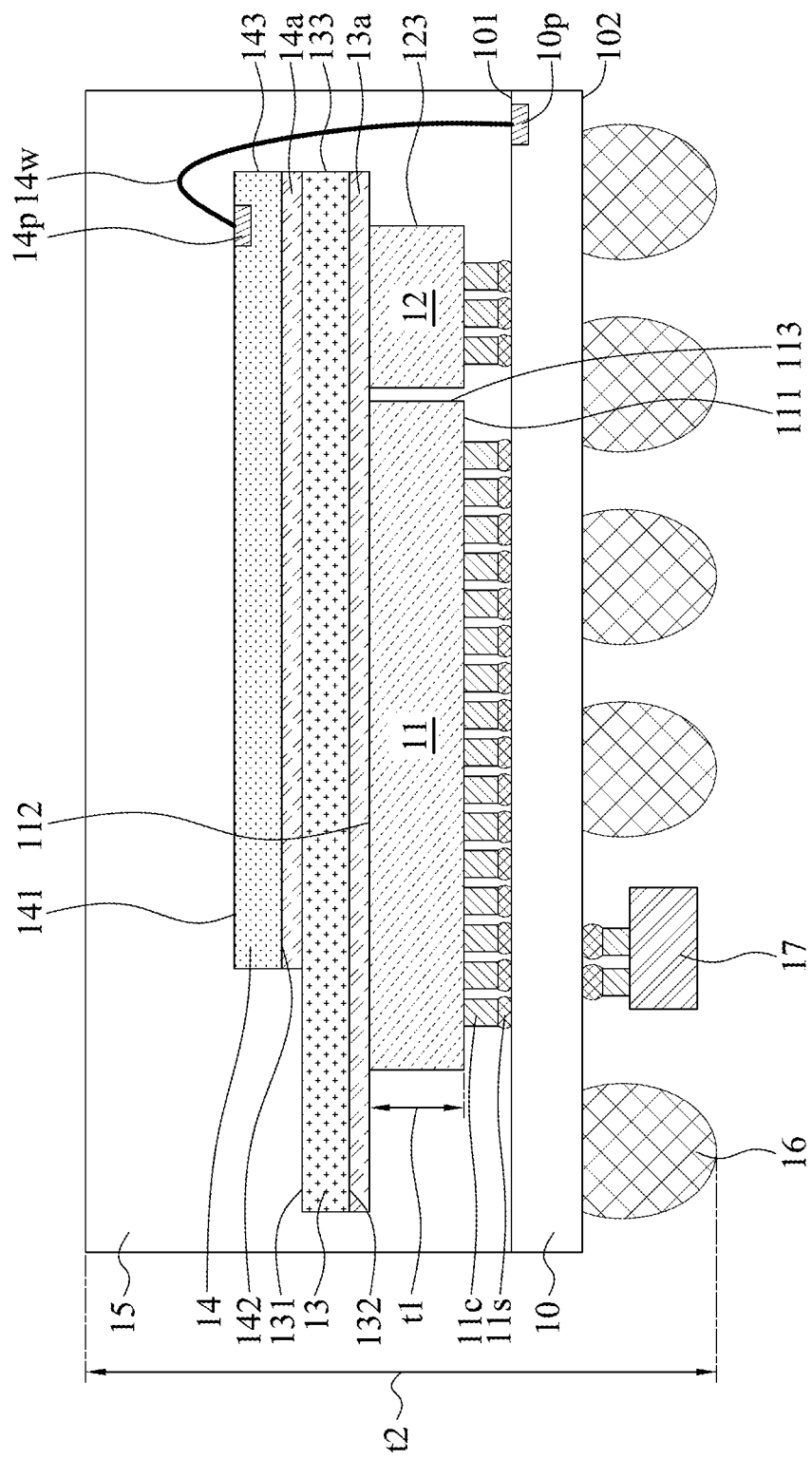
FIG. 1A illustrates a cross-sectional view of a semiconductor device package in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a cross-sectional view of a semiconductor device package 1 in accordance with some embodiments of the present disclosure. The semiconductor device package 1 includes a carrier 10, electronic components 11, 13, 14, 17, a support structure 12, an encapsulant 15 and an electrical contact 16.

In some embodiments, the semiconductor device package 1 may be or include, for example, an electronic device or an electronic package. In some embodiments, the semiconductor device package 1 may be or include, for example, a wireless device, such as a user equipment (UE), a mobile station, a mobile device, an apparatus communicating with the Internet of Things (IoT), etc.

The carrier 10 may be or include a printed circuit board, such as a paper-based copper foil laminate, a composite copper foil laminate, or a polymer-impregnated glass-fiber-based copper foil laminate. In some embodiments, the carrier 10 may be, or may include, an interconnection structure, such as a circuit layer, a build-up layer, a redistribution layer (RDL), a conductive trace or a conductive via.

For example, the carrier 10 may include one or more conductive layers and one or more dielectric layers. A portion of the conductive layer is covered or encapsulated by the dielectric layer while another portion of the conductive layer is exposed from the dielectric layer. In some embodiments, the carrier 10 may include conductive vias (e.g., through vias) penetrating the dielectric layer to electrically connect the conductive layers.

In some embodiments, the carrier 10 may include at least three conductive layers and at least three dielectric layers. For example, the carrier 10 may include four conductive layers and four dielectric layers. For example, the carrier 10 may include five conductive layers and five dielectric layers. In some embodiments, the carrier 10 may have a thickness ranging from approximately 32 micrometers (μm) to approximately 60 μm.

The carrier 10 has a surface 101 and a surface 102 opposite to the surface 101. In some embodiments, the surface 101 and the surface 102 may be substantially parallel.

In some embodiments, the carrier 10 may include one or more conductive pads 10p in proximity to, adjacent to, or embedded in and exposed at the surface 101 and/or the surface 102 of the carrier 10. The carrier 10 may include a solder resist (not shown) on the surface 101 and/or the surface 102 to fully expose or to expose at least a portion of the conductive pads 10p for electrical connections.

The electronic components 11, 13, 14 and 17 may communicate with one another through the carrier 10. For example, the electronic component 11 may communicate with the electronic component 13 through the carrier 10. For example, the electronic component 11 may communicate with the electronic component 14 through the carrier 10.

One or more electrical contacts 16 (e.g., solder balls) may be disposed on the conductive pads on the surface 102 of the carrier 10 and can provide electrical connections between the semiconductor package device 1 and external components (e.g., external circuits or circuit boards). In some embodiments, the electrical contact 16 may include a controlled collapse chip connection (C4) bump, a ball grid array (BGA) or a land grid array (LGA).

The electronic component 11 may be disposed on the surface 101 of the carrier 10. The electronic component 11 may be electrically connected to one or more other electrical components (if any) and to the carrier 10 (e.g., to the interconnection structure(s)), and the electrical connection may be attained by way of flip-chip, wire-bond techniques, metal to metal bonding (such as Cu to Cu bonding), or hybrid bonding. For example, the electronic component 11 may be electrically connected with (or electrically connected to) the carrier 10 through a conductive pillar (e.g., a Cu pillar) 11c and a soldering material 11s (e.g., a solder ball).

In some embodiments, the soldering material 11s can be omitted and the conductive pillar 11c may directly contact the surface 101 of the carrier 10.

In some embodiments, the electronic component 11 may be a chip or a die including a semiconductor substrate, one or more integrated circuit (IC) devices and one or more overlying interconnection structures therein. In some embodiments, the electronic component 11 may be a processor or an IC die, such as a radio frequency IC (RFIC), a power management IC (PMIC), an application specific integrated circuit (ASIC), a field-programmable gate array (FPGA), etc. In some embodiments, the electronic component 11 may have a thickness t1 ranging from approximately 75 μm to approximately 130 μm.

The electronic component 11 has a surface (or may be referred to as an active surface) 111, a surface (or may be referred to as a backside surface) 112 opposite to the surface 111 and a surface (or may be referred to as a lateral surface) 113 extending between the surface 111 and the surface 112. The surface 111 of the electronic component 11 may face the carrier 10. The surface 112 of the electronic component 11 may face away from the carrier 10.

In some embodiments where the electronic component 11 is not ground (such as ground flat or ground down) or thinned from the backside surface 112, the electronic component 11 is thicker (may be about 130 μm). A roughness of the backside surface 112 may be substantially the same as a roughness of the lateral surface 113.

In some other embodiments where the electronic component 11 is ground or thinned from the backside surface 112, the electronic component 11 is thinner (may be less than about 130 μm). A roughness of the backside surface 112 may be different from a roughness of the lateral surface 113. For example, a roughness of the backside surface 112 may be greater than a roughness of the lateral surface 113. For example, a roughness of the backside surface 112 may be less than a roughness of the lateral surface 113.

The support structure 12 (or a support component) may be disposed on the surface 101 of the carrier 10 and spaced apart from the electronic component 11. For example, the support structure 12 may be separated (e.g., physically separated) from the electronic component 11. For example, the support structure 12 may not contact the surface 113 of the electronic component 11. For example, a gap may exist between the support structure 12 and the electronic component 11. In some embodiments, a part of the encapsulant 15 may be disposed between the support structure 12 and the electronic component 11.

The support structure 12 may not be electrically connected with the carrier 10. For example, the support structure 12 may be a non-functional die. For example, the support structure 12 may be or include a dummy die, such as a dummy silicon die. For example, the support structure 12 may not have an electrical path. For example, the support structure 12 may not be enabled or operated.

In some embodiments, the support structure 12 may be configured to support the electronic components 13 and 14 for structural stability. More specifically, the support structure 12 may be configured to balance the coefficient of thermal expansion (CTE) of the electronic components 13 and 14 and to prevent or alleviate warpage.

In some embodiments, the support structure 12 may have the same thickness as the electronic component 11. In some embodiments, the support structure 12 may have the same material as the electronic component 11. For example, the support structure 12 may be or include a substrate having the same semiconductor material as the electronic component 11.

The electronic component 13 may be disposed on the surface 112 of the electronic component 11 and the support structure 12. The electronic component 13 may be connected to the electronic component 11 and the support structure 12 through an adhesive layer 13a. The adhesive layer 13a may include a thermal grease, a thermal gel, a tape or die attach film (DAF). The adhesive layer 13a may include an epoxy resin, a cyanoacrylate, a phase-change material, a polymer or a ceramic material. The adhesive layer 13a may be disposed between the electronic component 13 and the electronic component 11. A part of the adhesive layer 13a may be exposed from the electronic component 11 and covered by the encapsulant 15.

In some embodiments, the electronic component 13 may be a chip or a die including a semiconductor substrate, one or more IC devices and one or more overlying interconnection structures therein. In some embodiments, the electronic component 13 may be a memory device, such as a non-volatile memory device. In some embodiments, the electronic component 13 may be a NAND flash die, a read only memory (ROM), a phase change random access memory (PRAM), etc.

The electronic component 13 has a surface (or may be referred to as an active surface) 131, a surface (or may be referred to as a backside surface) 132 opposite to the surface 131 and a surface (or may be referred to as a lateral surface) 133 extending between the surface 131 and the surface 132. The surface 132 of the electronic component 13 may face the carrier 10. The surface 131 of the electronic component 13 may face away from the carrier 10. The surface 131 of the electronic component 13 may be farther from the carrier 10 than the surface 132.

The electronic component 13 and the electronic component 11 may be disposed back to back. In other words, the active surface 131 of the electronic component 13 and the active surface 111 of the electronic component 11 may face to opposite sides.

One or more conductive pads (such as the conductive pad 13p shown in FIG. 1B) may be provided on the surface 131 of the electronic component 13. The conductive pad may provide electrical connections between the carrier 10 and the electronic component 13.

In some embodiments, the electronic component 13 may be electrically connected with the carrier 10. For example, the electronic component 13 may be electrically connected with the carrier 10 through a conductive wire (such as the conductive wire 13w shown in FIG. 1B) connected between a conductive pad on the surface 101 of the carrier 10 and a conductive pad (such as the conductive pad 13p shown in FIG. 1B) on the surface 131 of the electronic component 13.

In some embodiments, the electronic component 13 may be electrically connected with the carrier 10 without passing through the electronic component 11. For example, electrical connections between the carrier 10 and the electronic component 13 may be attained without the electronic component 11. For example, an electrical path between the carrier 10 and the electronic component 13 may not pass through the electronic component 11. For example, a conductive wire (such as the conductive wire 13w shown in FIG. 1B) connected between the carrier 10 and the electronic component 13 may not pass through the electronic component 11.

For example, the electronic component 13 may not directly communicate with the electronic component 11. For example, the electronic component 13 may communicate with the electronic component 11 through the carrier 10.

The electronic component 14 may be disposed on the surface 131 of the electronic component 13. The electronic component 13 may be disposed between the electronic component 14 and the electronic component 11. The electronic component 13 may be disposed between the electronic component 14 and the support structure 12. The electronic component 14 may be connected to the electronic component 13 through an adhesive layer 14a. The adhesive layer 14a may be similar to the adhesive layer 13a.

In some embodiments, the electronic component 14 may be a chip or a die including a semiconductor substrate, one or more IC devices and one or more overlying interconnection structures therein. In some embodiments, the electronic component 14 may be a memory device, such as a volatile memory device. In some embodiments, the electronic component 14 may be a dynamic random-access memory (DRAM), a synchronous dynamic random-access memory (SDRAM), a double data rate (DDR) SDRAM, a low power double data rate (LPDDR) SDRAM, etc. In some embodiments, the electronic component 14 and the electronic component 13 may be different kinds of memory devices. In some embodiments, the electronic component 14 and the electronic component 13 may be the same kind of memory device.

The electronic component 14 has a surface (or may be referred to as an active surface) 141, a surface (or may be referred to as a backside surface) 142 opposite to the surface 141 and a surface (or may be referred to as a lateral surface) 143 extending between the surface 141 and the surface 142. The surface 142 of the electronic component 14 may face the carrier 10. The surface 141 of the electronic component 14 may face away from the carrier 10.

In some embodiments, the surface 143 of the electronic component 14 and the surface 133 of the electronic component 13 may be substantially coplanar. In some embodiments, the surface 143 of the electronic component 14 and the surface 133 of the electronic component 13 may protrude from the surface 123 of the support structure 12. For example, the electronic component 14 and the electronic component 13 may have an overhang structure extending outwardly with respect to the surface 123 of the support structure 12.

One or more conductive pads 14p may be provided on the surface 141 of the electronic component 14. The conductive pads 14p may provide electrical connections between the carrier 10 and the electronic component 14.

In some embodiments, the electronic component 14 may be electrically connected with the carrier 10. For example, the electronic component 14 may be electrically connected with the carrier 10 through a conductive wire 14w connected between the conductive pad 10p on the surface 101 of the carrier 10 and the conductive pad 14p on the surface 141 of the electronic component 14.

In some embodiments, the electronic component 14 may be electrically connected with the carrier 10 without passing through the electronic component 11. For example, electrical connections between the carrier 10 and the electronic component 14 may be attained without the electronic component 11. For example, an electrical path between the carrier 10 and the electronic component 14 may not pass through the electronic component 11. For example, the conductive wire 14w may not pass through the electronic component 11. The conductive wire 14w may extend from the surface 141 of the electronic component 14 and pass over (or extend across)

the surface 133 of the electronic component 13 and the surface 123 of the support structure 12.

For example, the electronic component 14 may not directly communicate with the electronic component 11. For example, the electronic component 14 may communicate with the electronic component 11 through the carrier 10.

The encapsulant 15 (which may also be referred to as a package body) may be disposed on the surface 101 of the carrier 10 to cover the electronic components 11, 13 and 14 and the support structure 12.

The encapsulant 15 may surround or cover the surface 113 of the electronic component 11 and the surface 123 of the support structure 12. The encapsulant 15 may be disposed between the electronic component 11 and the support structure 12. The encapsulant 15 may surround or cover the surface 133 of the electronic component 13 and the surface 143 of the electronic component 14. The encapsulant 15 may also cover a part of the surface 131 of the electronic component 13 and the surface 141 of the electronic component 14.

Using the encapsulant 15 covering the electronic components 11, 13 and 14 and the support structure 12 may prevent the electronic components 13 and 14 from being peeled off from the carrier 10 (i.e., delamination issue).

In some embodiments, the encapsulant 15 may include a single or monolithic layer. For example, the components on the carrier 10 can be encapsulated by a single or monolithic layer.

In some embodiments, the encapsulant 15 may include an epoxy resin having fillers, a molding compound (e.g., an epoxy molding compound or other molding compound), a polyimide, a phenolic compound or material, a material with a silicone dispersed therein, or a combination thereof.

The electronic component 17 may be disposed on the surface 102 of the carrier 10. The electronic component 17 may be disposed among the electrical contacts 16. The height of the electronic component 17 may be less than the height of the electrical contacts 16.

The electronic component 17 may be a chip or a die including a semiconductor substrate, one or more IC devices and one or more overlying interconnection structures therein. The IC devices may include active devices such as transistors and/or passive devices such resistors, capacitors, inductors, or a combination thereof.

In some comparative embodiments, a substrate or an interposer may be provided between a memory device package (such as a package including the electronic components 13 and 14) and a logic device package (such as a package including the electronic component 11). With the substrate or interposer, the memory device package can be electrically connected to the logic device package by being vertically stacked onto each other through a package-on-package (PoP) technique. However, as technology advances, a semiconductor device package which is smaller in size is desired.

According to some embodiments of the present disclosure, a substrate or interposer is not needed between the memory device (such as the electronic components 13 and 14) and the logic device (such as the electronic component 11), which helps to reduce the thickness of the semiconductor device package 1. The electronic components 13 and 14 can be electrically connected with the electronic component 11 through the carrier 10. In some embodiments, the semiconductor device package 1 may have a thickness t2 less than about 730 In some embodiments, the thickness t2 may range from approximately 555 μm to approximately 610 μm.

The electronic component 13 may be electrically connected with the carrier 10 through a conductive wire (such as the conductive wire 13w shown in FIG. 1B) without passing through the electronic component 11. Similarly, the electronic component 14 may be electrically connected with the carrier 10 through the conductive wires 14w without passing through the electronic component 11. Therefore, the data rate between the electronic component 13 (or the electronic component 14) and the carrier 10 can be higher and the communication quality therebetween can be enhanced.

In addition, since the substrate or interposer is removed, the electronic components 13 and 14 can be directly disposed on the electronic component 11. However, the electronic components 13 and 14 are usually larger than the electronic component 11, and such unbalanced structure would cause a warpage issue during the manufacturing process, which may result in the failure of the semiconductor device package. Accordingly, by interposing the support structure 12 between the electronic component 13 and the carrier 10 for structural stability, the warpage issue may be eliminated or mitigated.

Figure 1B:
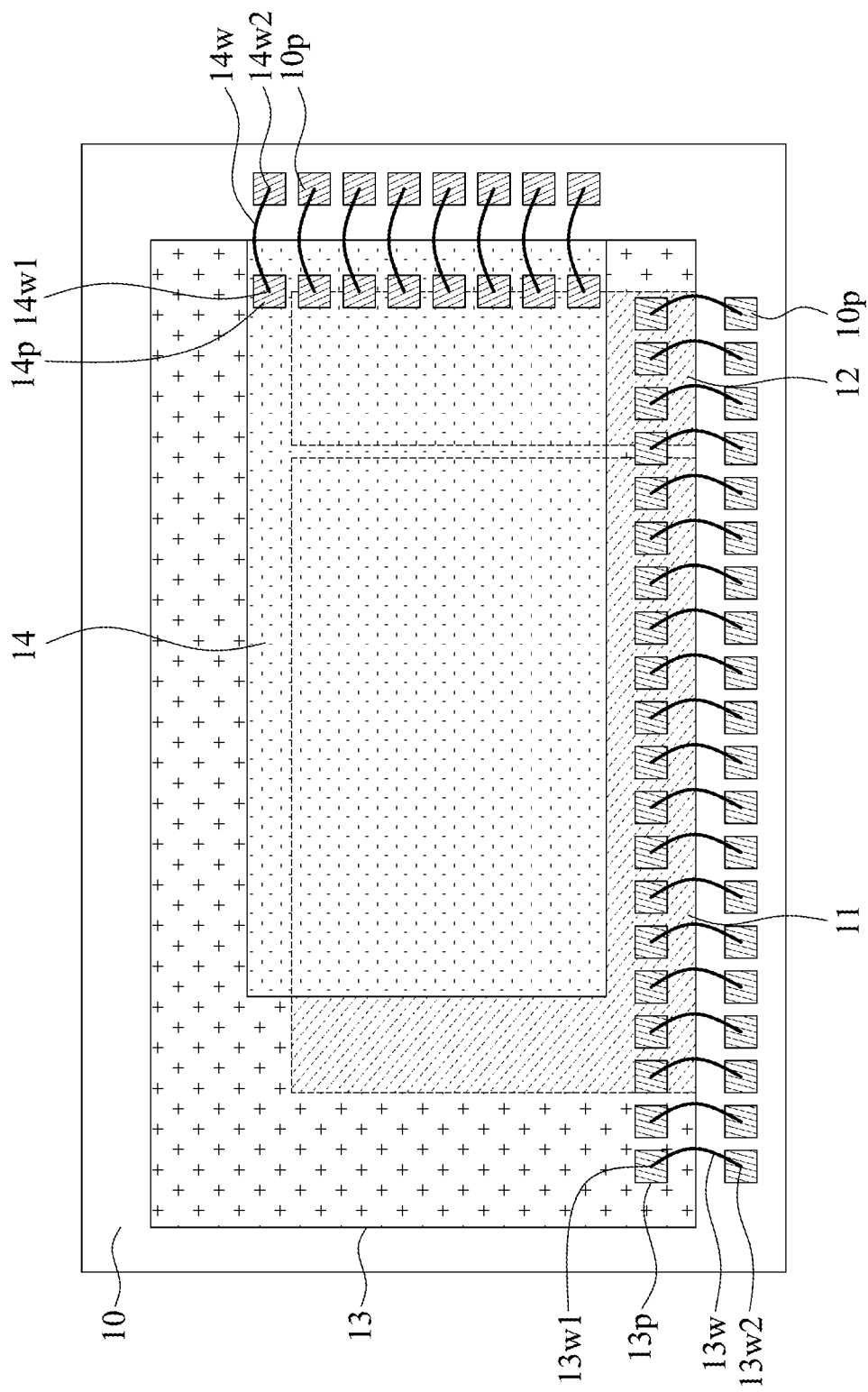
FIG. 1B illustrates a top view of a semiconductor device package in accordance with some embodiments of the present disclosure.

FIG. 1B illustrates a top view of a semiconductor device package in accordance with some embodiments of the present disclosure. In some embodiments, the top view in FIG. 1B may be a top view of the semiconductor device package 1 in FIG. 1A.

In some embodiments, the electronic component 13 may be larger than the electronic component 11. A projection of the electronic component 11 on the surface 101 of the carrier 10 (as shown in FIG. 1A) is within a projection of the electronic component 13 on the surface 101 of the carrier 10. Similarly, the electronic component 13 may be larger than the support structure 12. A projection of the support structure 12 on the surface 101 of the carrier 10 (as shown in FIG. 1A) is within a projection of the electronic component 13 on the surface 101 of the carrier 10.

The electronic component 13 may have a set of conductive pads 13p arranged along a side thereof. Each of the conductive pads 13p may be electrically connected with one conductive wire 13w. The conductive pads 13p may exposed from the electronic component 14. The conductive pads 13p may not covered by the electronic component 14.

Each of the conductive wires 13w may have a contact end or a contact point 13w1 on the corresponding conductive pad 13p and an opposite contact end or a contact point 13w2 on a conductive pad (such as the conductive pad 10p in FIG. 1A) of the carrier 10.

The support structure 12 and the electronic component 13 may be overlapping (e.g., partially overlapping) in a direction substantially perpendicular to the surfaces 101 and/or 102 of the carrier 10. In some embodiments, some of the conductive pads 13p of the electronic component 13 may be overlapping with the support structure 12 in a direction substantially perpendicular to the surfaces 101 and/or 102 of the carrier 10. In some embodiments, the support structure 12 may be overlapped by some of the conductive pads 13p of the electronic component 13 vertically. Therefore, the contact points 13w1 on the corresponding conductive pads 13p may be supported by the support structure 12 during a wire-bonding process. (e.g., during connecting the conductive wires 13w on the conductive pads 13p)

Similarly, the electronic component 11 and the electronic component 13 may be overlapping (e.g., partially overlapping) in a direction substantially perpendicular to the surfaces 101 and/or 102 of the carrier 10. In some embodiments, some of the conductive pads 13p of the electronic component 13 may be overlapping with the electronic component 11 in a direction substantially perpendicular to the surfaces 101 and/or 102 of the carrier 10. Therefore, the contact points 13w1 on the corresponding conductive pads 13p may be supported by the electronic component 11 during a wire-bonding process. (e.g., during connecting the conductive wires 13w on the conductive pads 13p)

The electronic component 14 may have a set of conductive pads 14p arranged along a side thereof. The arrangement direction of the conductive pads 14p may be non-parallel with the arrangement direction of the conductive pads 13p. The arrangement direction of the conductive pads 14p may be substantially perpendicular to the arrangement direction of the conductive pads 13p.

Each of the conductive pads 14p may be electrically connected with one conductive wire 14w. Each of the conductive wires 14w may have a contact end or a contact point 14w1 on the corresponding conductive pad 14p and an opposite contact end or a contact point 14w2 on a conductive pad (such as the conductive pad 10p in FIG. 1A) of the carrier 10.

The support structure 12 and the electronic component 14 may be overlapping (e.g., partially overlapping) in a direction substantially perpendicular to the surfaces 101 and/or 102 of the carrier 10. In some embodiments, some of the conductive pads 14p of the electronic component 14 may be overlapping with the support structure 12 in a direction substantially perpendicular to the surfaces 101 and/or 102 of the carrier 10. In some embodiments, the support structure 12 may be overlapped by at least some of the conductive pads 14p of the electronic component 14 vertically. Therefore, the contact points 14w1 on the corresponding conductive pads 14p may be supported by the support structure 12 during a wire-bonding process (e.g., during connecting the conductive wires 14w on the conductive pads 14p).

Figure 2A:
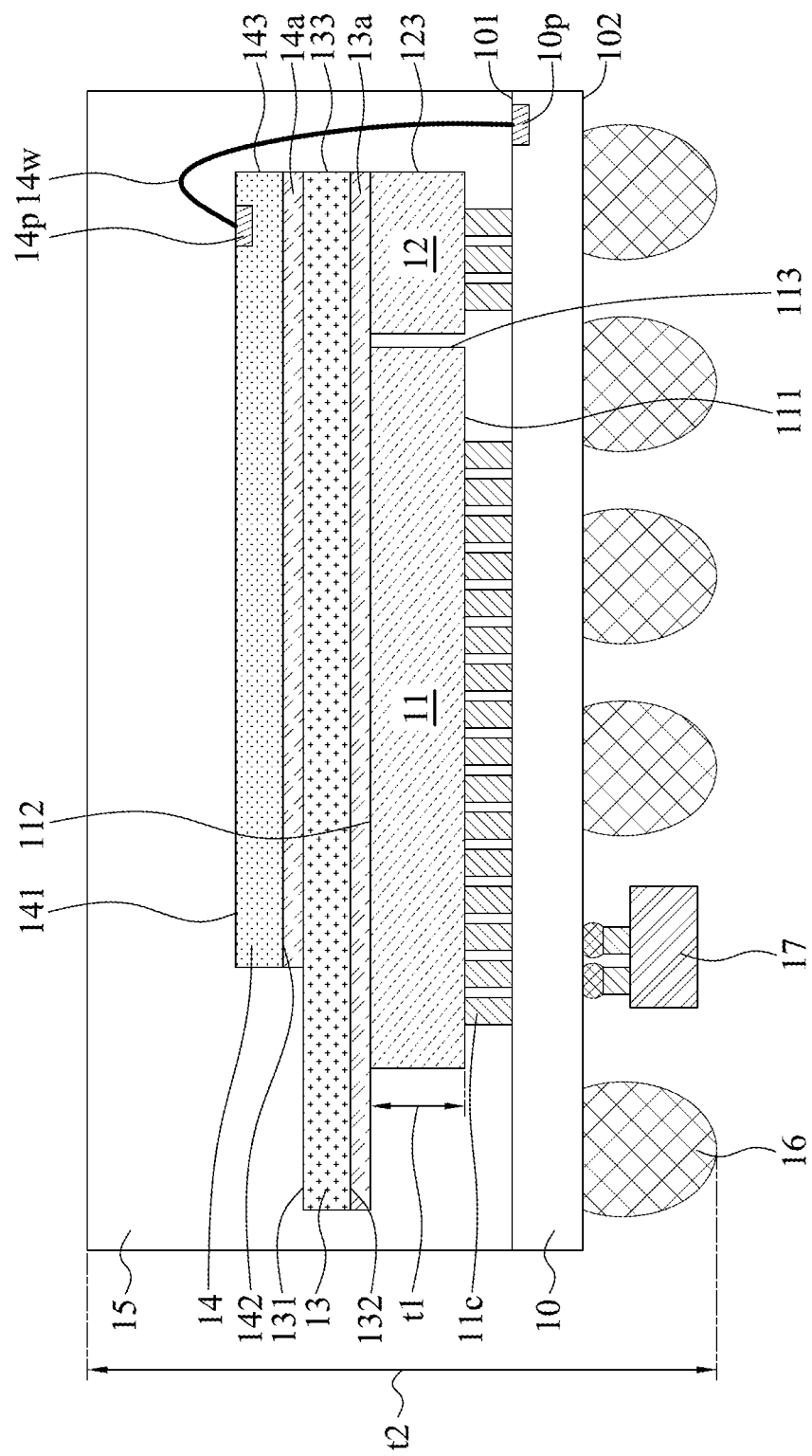
FIG. 2A illustrates a cross-sectional view of a semiconductor device package in accordance with some embodiments of the present disclosure.
Figure 2B:
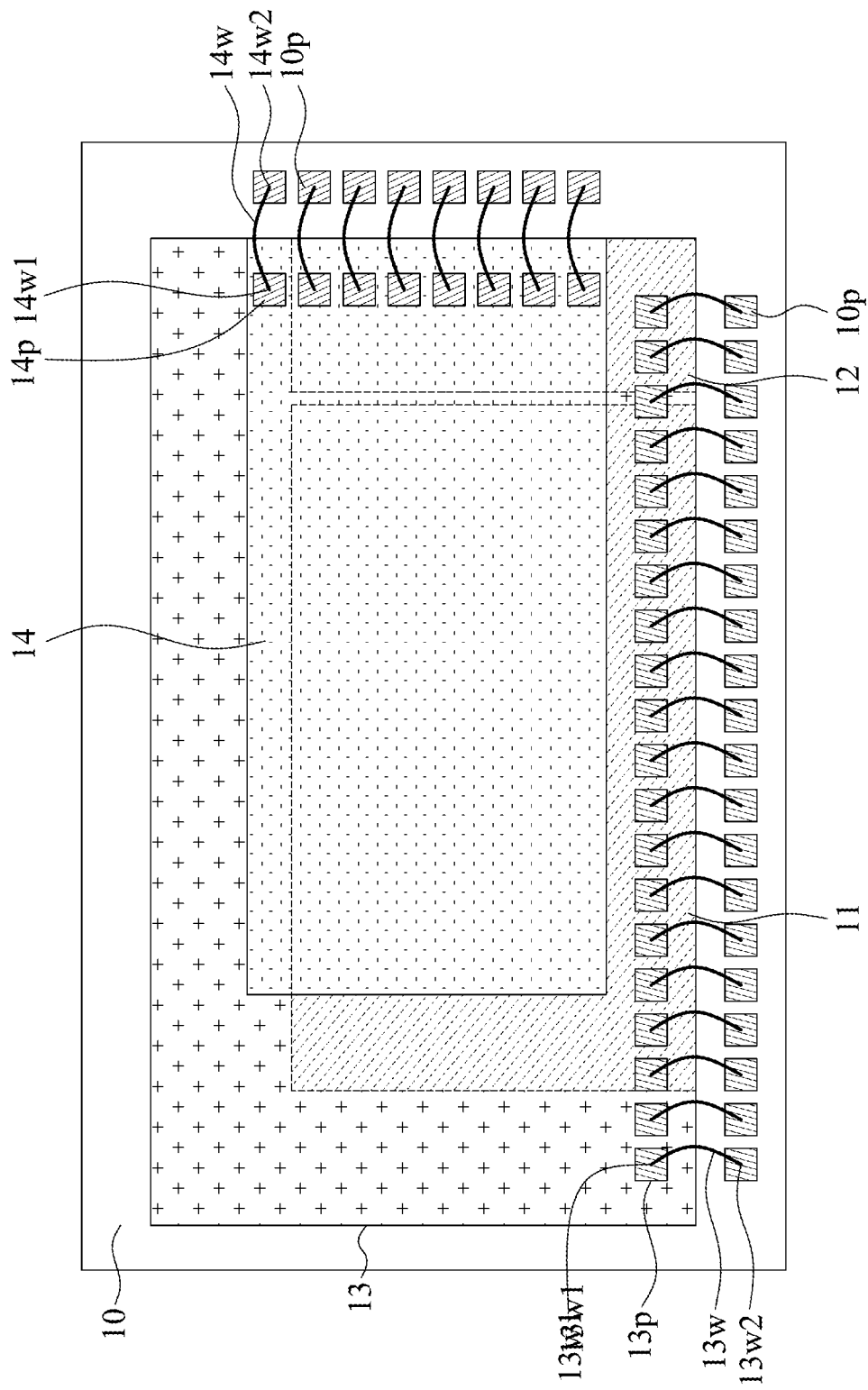
FIG. 2B illustrates a top view of a semiconductor device package in accordance with some embodiments of the present disclosure.

FIG. 2A illustrates a cross-sectional view of a semiconductor device package 2 in accordance with some embodiments of the present disclosure. FIG. 2B illustrates a top view of a semiconductor device package in accordance with some embodiments of the present disclosure. In some embodiments, the top view in FIG. 2B may be a top view of the semiconductor device package 2 in FIG. 2A. The semiconductor device package 2 of FIG. 2A is similar to the semiconductor device package 1 of FIG. 1A, and the differences therebetween are described below.

The surface 123 (such as a lateral surface) of the support structure 12 and the surface 133 (such as a lateral surface) of the electronic component 13 may be substantially coplanar. As can be seen from the top view of FIG. 2B, the conductive pads 14p of the electronic component 14 may be entirely overlapping with the support structure 12 in a direction substantially perpendicular to the surfaces 101 and/or 102 of the carrier 10. Therefore, the contact points 14w1 on the corresponding conductive pads 14p may be fully supported by the support structure 12 during a wire-bonding process. (e.g., during connecting the conductive wires 14w on the conductive pads 14p)

Figure 3A:
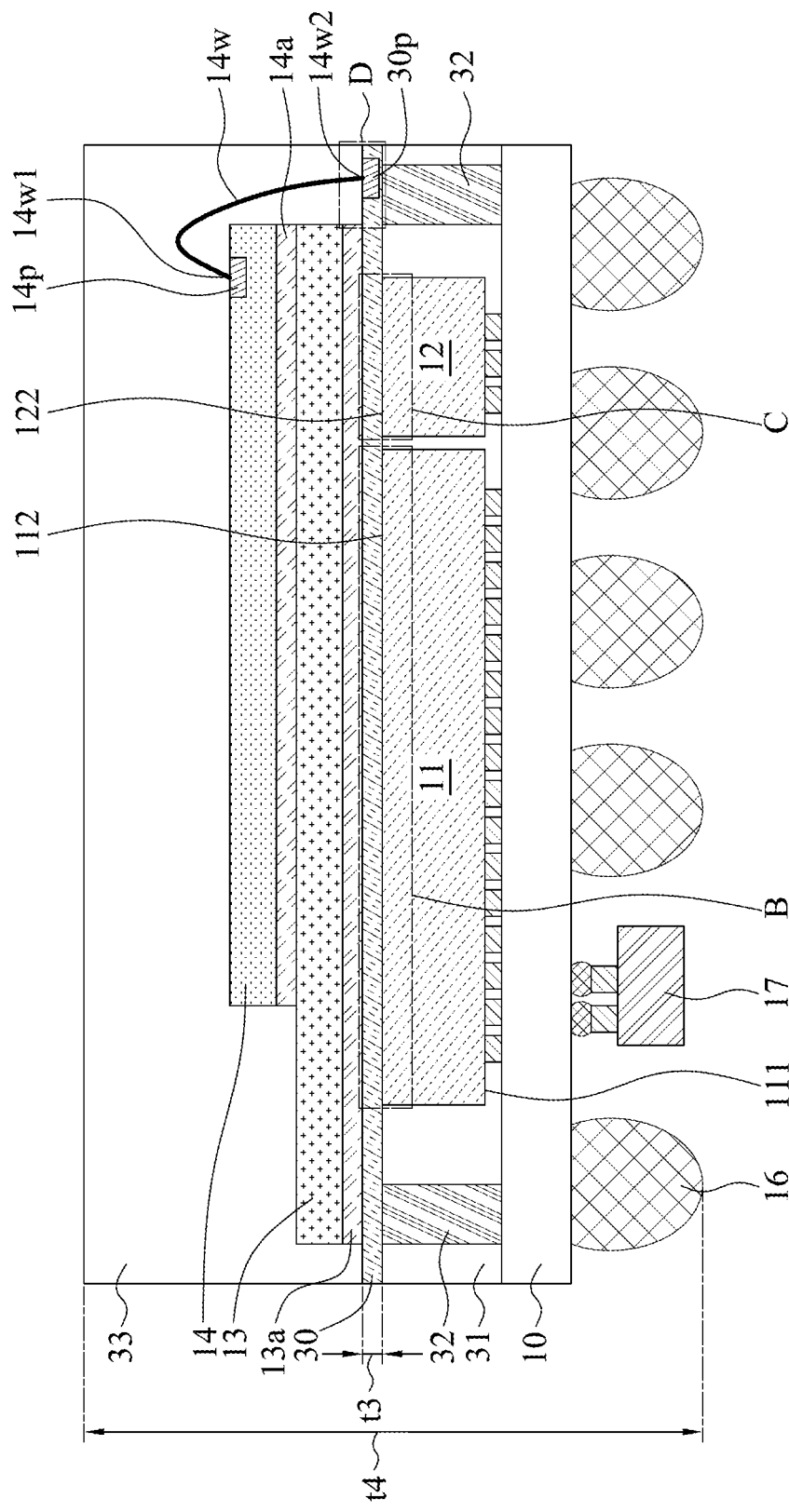
FIG. 3A illustrates a cross-sectional view of a semiconductor device package in accordance with some embodiments of the present disclosure.

FIG. 3A illustrates a cross-sectional view of a semiconductor device package 3 in accordance with some embodiments of the present disclosure. The semiconductor device package 3 of FIG. 3A is similar to the semiconductor device package 1 of FIG. 1A, and the differences therebetween are described below.

The semiconductor device package 3 includes a carrier 30 disposed between the electronic component 11 and the electronic component 13. The carrier 30 is also disposed between the support structure 12 and the electronic component 13. One or more conductive structures 32 may be disposed between the carrier 30 and the carrier 10 and provide electrical connections between the carrier 30 and the carrier 10. Encapsulant 31 and encapsulant 33 may be disposed on opposite sides of the carrier 30. The encapsulant 31 and encapsulant 33 may be separated from each other through the carrier 30.

Similar to the carrier 10, the carrier 30 may be or include a printed circuit board. In some embodiments, the carrier 30 may be, or may include, an interconnection structure, such as a circuit layer, a build-up layer, an RDL, a conductive trace or a conductive via. In some embodiments, the carrier 30 may include one or more conductive pads 30p in proximity to, adjacent to, or embedded in and exposed at a surface thereof.

In some embodiments, a thickness t3 of the carrier 30 may be less than a thickness of the carrier 10. For example, the carrier 30 may have a thickness t3 less than approximately 32 µm, such as 22 µm.

In some embodiments, the carrier 30 may have fewer conductive layers than the carrier 10. For example, the carrier 30 may have two conductive layers. In some embodiments, the carrier 30 may have fewer dielectric layers than the carrier 10. For example, the carrier 30 may have two dielectric layers.

The encapsulant 31 may be disposed on the carrier 10 to cover the conductive structures 32, the electronic component 11 and the support structure 12. The encapsulant 33 may be disposed on the carrier 30 to cover the electronic components 13 and 14. The encapsulant 31 and the encapsulant 33 may be similar to the encapsulant 15 in FIG. 1A.

Figure 4A:
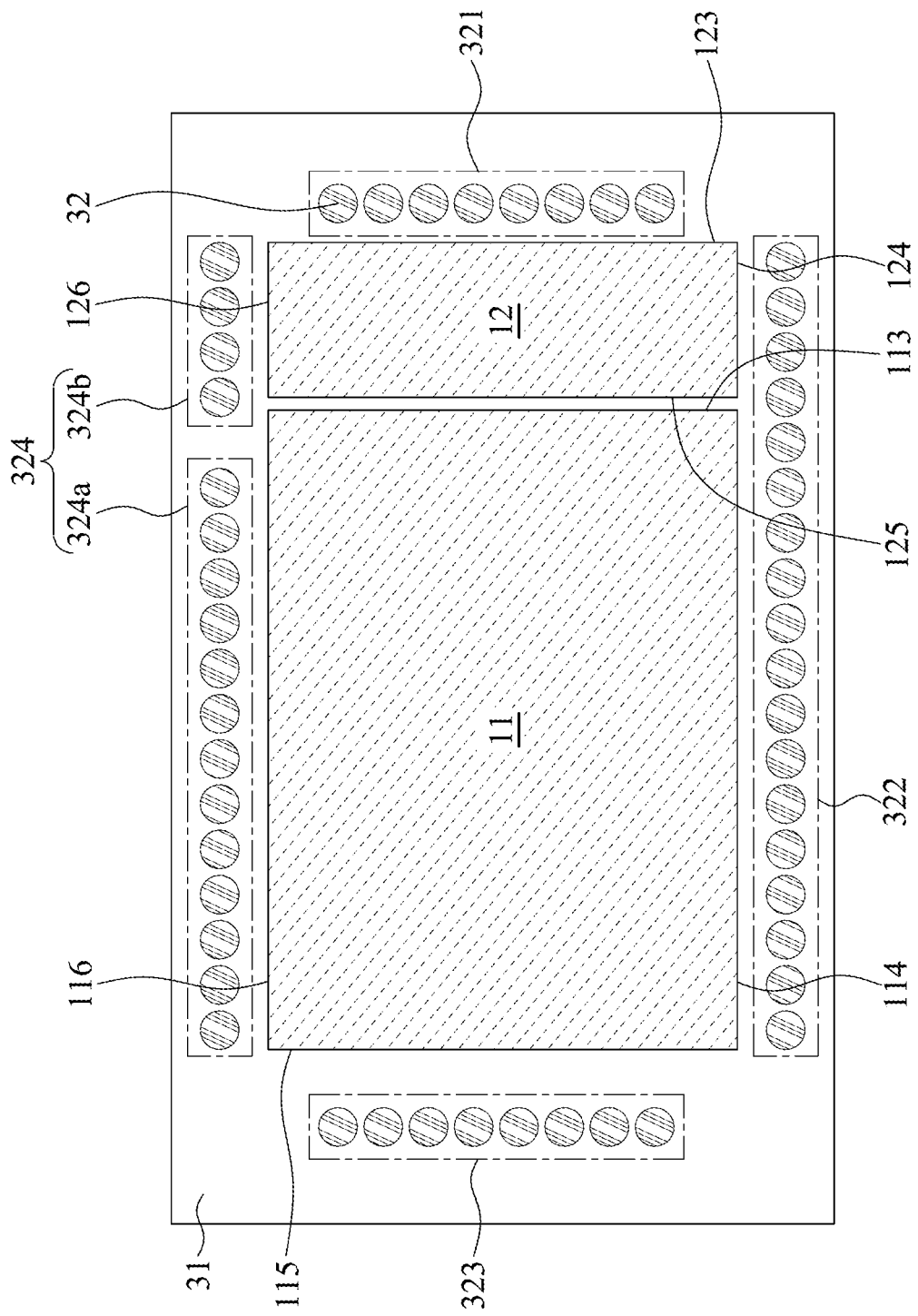
FIG. 4A illustrates a top view of a part of a semiconductor device package in accordance with some embodiments of the present disclosure.

The conductive structures 32 may be disposed around the electronic component 11 and the support structure 12 (as shown in FIG. 4A). For example, the conductive structures 32 may be disposed along sides of the electronic component 11 and/or the support structure 12.

The conductive structure 32 may be surrounded or covered by the encapsulant 31. The conductive structure 32 may penetrate through the encapsulant 31. The conductive structure 32 may contact the carrier 10 and/or the carrier 30. The conductive structure 32 may be configured to transmit signal between the carrier 10 and the carrier 30. For example, the conductive structure 32 may be configured to transmit signal between the carrier 10 and the electronic component 13. The conductive structure 32 may be configured to transmit signal between the carrier 10 and the electronic component 14.

The conductive structure 32 may be or include a conductive pillar (such as a copper pillar), a conductive via or a conductive wall. In some embodiments, the conductive structure 32 may include a pillar with a substantially vertical sidewall profile or a stud bump having a convex bulge profile at the end proximal to the carrier 10 or the carrier 30.

In some embodiments, a top surface of the conductive structure 32 and the surface 112 of the electronic component 11 may be substantially coplanar. In some other embodiments, the conductive structure 32 may be a tall pillar where a top surface thereof is higher than the surface 112 of the electronic component 11.

In some embodiments, the conductive structure 32 may include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The electronic component 13 may be electrically connected with the carrier 10 without passing through the electronic component 11. For example, the electronic component 13 may be electrically connected with the carrier 10 through a conductive wire (such as the conductive wire 13w shown in FIG. 4B), the carrier 30 and the conductive structure 32.

For example, the electronic component 13 may be electrically connected with the carrier 30 through a conductive wire (such as the conductive wire 13w shown in FIG. 4B) connected between the conductive pad 30p of the carrier 30 and a conductive pad (such as the conductive pad 13p shown in FIG. 4B) of the electronic component 13.

The electronic component 14 may be electrically connected with the carrier 10 without passing through the electronic component 11. For example, the electronic component 14 may be electrically connected with the carrier 10 through the conductive wire 14w, the carrier 30 and the conductive structure 32.

For example, the electronic component 14 may be electrically connected with the carrier 30 through the conductive wire 14w connected between the conductive pad 30p of the carrier 30 and the conductive pad 14p of the electronic component 14.

By connecting the conductive wires (from the electronic component 13 and/or the electronic component 14) with the carrier 10 through the carrier 30 and the conductive structure 32, the conductive wires can be shorter. Risks (such as breaking of bonding wires) during a molding process can be lower. The communication quality therebetween can be more stable.

In addition, similar to FIG. 1A, since a substrate or interposer is not needed between the memory device (such as the electronic components 13 and 14) and the logic device (such as the electronic component 11), the thickness of the semiconductor device package 1 can be reduced. In some embodiments, the semiconductor device package 3 may have a thickness t4 less than about 730 μm. In some embodiments, the thickness t3 may range from approximately 555 μm to approximately 610 μm, such as 592 μm.

Figure 3B:
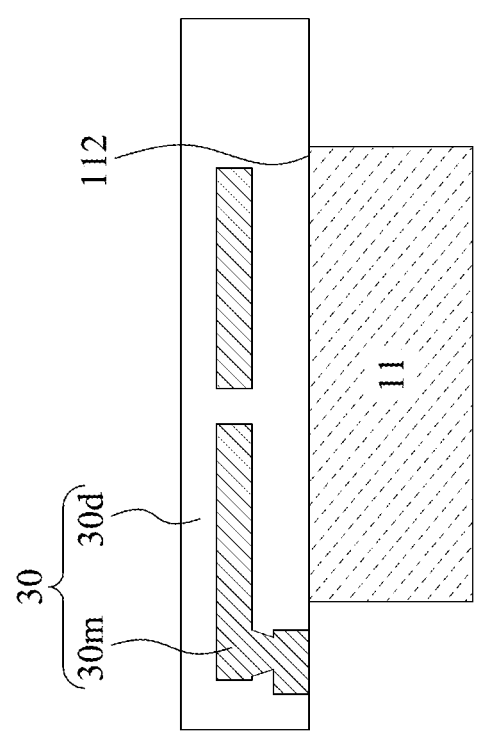
FIG. 3B illustrates an enlarged view of the part in dashed box B in FIG. 1A in accordance with some embodiments of the present disclosure.
Figure 3C:
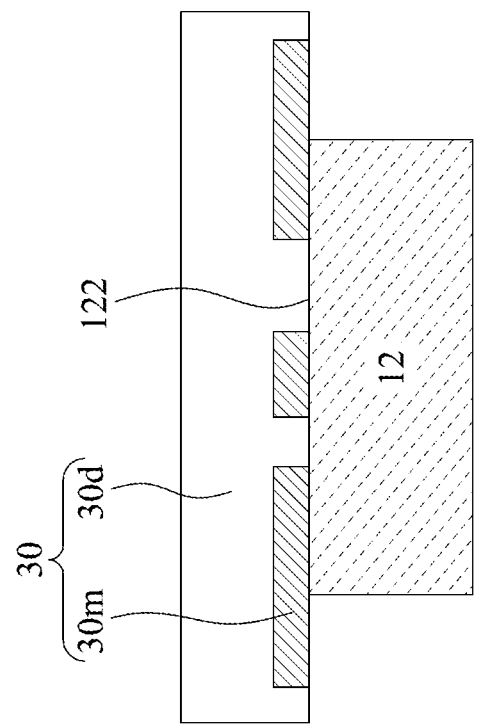
FIG. 3C illustrates an enlarged view of the part in dashed box C in FIG. 1A in accordance with some embodiments of the present disclosure.
Figure 3D:
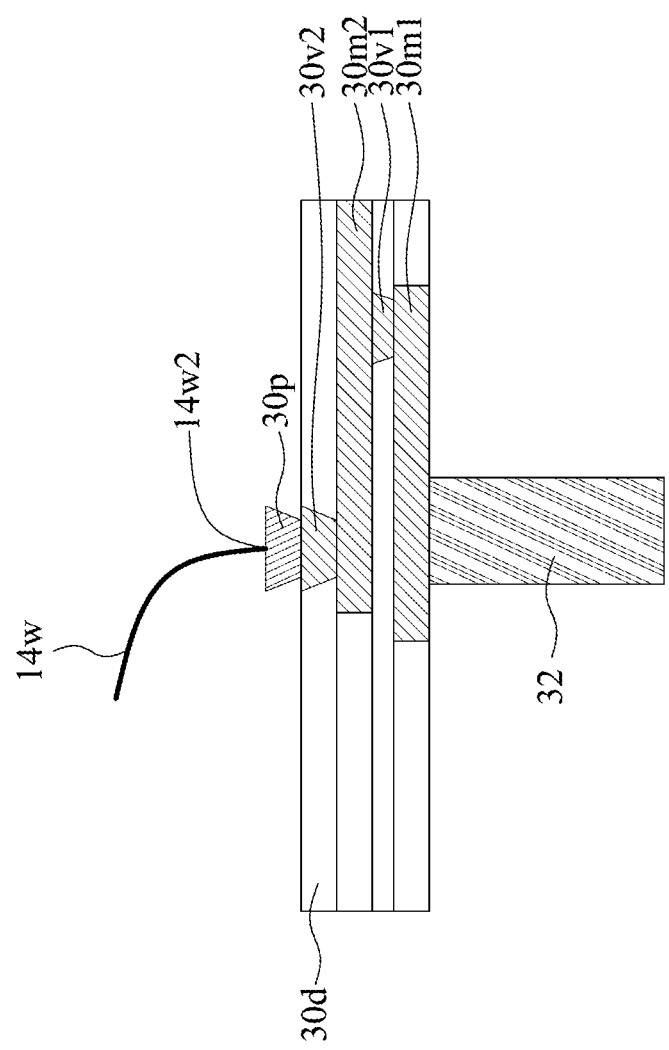
FIG. 3D illustrates an enlarged view of the part in dashed box D in FIG. 1A in accordance with some embodiments of the present disclosure.

FIGS. 3B, 3C and 3D illustrate enlarged views of the parts in dashed boxes B, C and D in FIG. 3A in accordance with some embodiments of the present disclosure.

Referring to FIG. 3D, the carrier 30 may include conductive layers 30m1 and 30m2 and one or more dielectric layers (such as four layers) 30d. The conductive wire 14w may have a contact end or a contact point 14w2 on the corresponding conductive pad 30p. The conductive pad 30p may have an inclined sidewall as shown in FIG. 3D. However, in some other embodiments, the conductive pad 30p may have a substantially vertical sidewall.

The conductive pad 30p may be electrically connected with the conductive layer 30m2 through a conductive via 30v2. The conductive via 30v2 may be wider than the conductive pad 30p. The conductive via 30v2 may taper from the conductive pad 30p to the conductive layer 30m2.

The conductive layer 30m2 may be electrically connected with the conductive layer 30m1 through a conductive via 30v1. The conductive via 30v1 may taper from the conductive layer 30m2 to the conductive layer 30m1. The conductive via 30v1 may be spaced apart from the conductive via 30v2. For example, the conductive via 30v1 and the conductive via 30v2 may not overlapping in a direction substantially perpendicular to the surfaces 101 and/or 102 of the carrier 10 shown in FIG. 3A.

The conductive layer 30m1 may contact a top surface of the conductive structure 32. The conductive structure 32 may be spaced apart from the conductive via 30v1. For example, the conductive via 30v1 and the conductive structure 32 may not overlapping in a direction substantially perpendicular to the surfaces 101 and/or 102 of the carrier 10 shown in FIG. 3A.

The conductive pad 30p, the conductive via 30v2 and the conductive structure 32 may be overlapping in a direction substantially perpendicular to the surfaces 101 and/or 102 of the carrier 10 shown in FIG. 3A. For example, the contact point 14w2 of the conductive wire 14w and the conductive pad 30p may be over the conductive structure 32. For example, the conductive structure 32 may be at least partially under the contact point 14w2 of the conductive wire 14w.

Therefore, the contact points 14w2 may be supported by the conductive structure 32 during a wire-bonding process. (e.g., during connecting the conductive wires 14w on the conductive pads 30p)

Referring back to FIG. 3B, the carrier 30 may include one or more conductive layers 30m (similar to the conductive layers 30m1 and 30m2 in FIG. 3D) and one or more dielectric layers 30d. A portion of the conductive layers 30m over the electronic component 11 may be physically spaced apart from the electronic component 11 through the dielectric layers 30d. For example, the conductive layers 30m may not contact the electronic component 11.

Referring to FIG. 3C, a portion of the conductive layers 30m over the support structure 12 may contact the support structure 12. For example, the conductive layers 30m may directly contact the support structure 12.

FIG. 4A illustrates a top view of a part of a semiconductor device package in accordance with some embodiments of the present disclosure. In some embodiments, the top view in FIG. 4A may be a top view of the electronic component 11, the support structure 12, the encapsulant 31 and the conductive structures 32 of the semiconductor device package 3 in FIG. 3A.

The electronic component 11 may include surfaces (or may be referred to as lateral surfaces or edges) 113, 114, 115 and 116. The support structure 12 may include surfaces (or may be referred to as lateral surfaces or edges) 123, 124, 125 and 126.

The surfaces 113, 115, 123 and 125 may be parallel. The surfaces 114, 116, 124 and 126 may be parallel. Each of the surfaces 113, 115, 123 and 125 may be substantially perpendicular to each of the surfaces 114, 116, 124 and 126.

The conductive structures 32 may include sets of conductive structures 321, 322, 323 and 423. The set of conductive structures 321 may be arranged along the surface 123. The set of conductive structures 322 may be arranged along the surface 124 and/or the surface 114. The set of conductive structures 323 may be arranged along the surface 115. The set of conductive structures 324 may be arranged along the surface 126 and/or the surface 116.

Figure 4B:
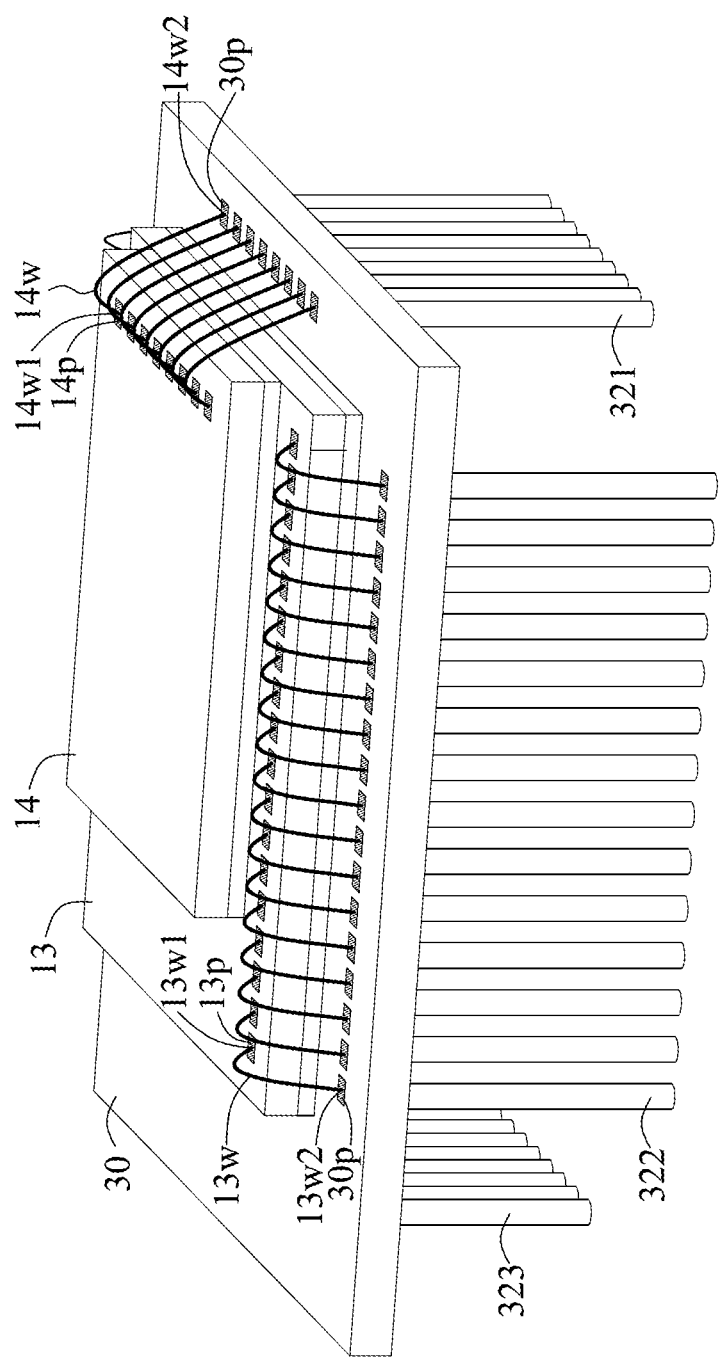
FIG. 4B illustrates a three-dimensional view of a part of a semiconductor device package in accordance with some embodiments of the present disclosure.

FIG. 4B illustrates a three-dimensional view of a part of a semiconductor device package in accordance with some embodiments of the present disclosure. In some embodiments, the three-dimensional view in FIG. 4B may be a three-dimensional view of the electronic components 13 and 14, the carrier 30 and the conductive structures 32 of the semiconductor device package 3 in FIG. 3A.

A set of conductive wires 14w may be electrically connected between the electronic component 14 and the carrier 30. In some embodiments, the set of conductive structures 321 may be electrically connected with the conductive wires 14w. In some embodiments, the contact points 14w2 of the conductive wires 14w and the carrier 30 may be over a corresponding conductive structure in the set of conductive structures 321. In some embodiments, a projection of the contact point 14w2 on the carrier 30 (or on the carrier 10 in FIG. 3A) may be within a projection of the corresponding conductive structure in the set of conductive structures 321.

A set of conductive wires 13w may be electrically connected between the electronic component 13 and the carrier 30. In some embodiments, the set of conductive structures 322 may be electrically connected with the conductive wires 13w. In some embodiments, the contact points 13w2 of the conductive wires 13w and the carrier 30 may be over a corresponding conductive structure in the set of conductive structures 322. In some embodiments, a projection of the contact point 13w2 on the carrier 30 (or on the carrier 10 in FIG. 3A) may be within a projection of the corresponding conductive structure in the set of conductive structures 322.

Referring to both FIGS. 4B and 4A, the set of conductive structures 323 may be electrically insulated from the electronic component 13 and/or the electronic component 14. In some embodiments, the set of conductive structures 323 may be configured to provide electromagnetic interference (EMI) shielding protection for the electronic component 11. For example, the set of conductive structures 323 may be configured to provide EMI shielding to prevent the electronic component 11 from being interfered with by other electronic components, and vice versa. In some embodiments, the set of conductive structures 323 may be dummy conductive structures or dummy pillars.

In some embodiments, the set of conductive structures 323 may be configured to support the electronic components 13 and 14 for structural stability. More specifically, the set of conductive structures 323 may be configured to balance the copper coverage of the carrier 30 and to prevent warpage.

In some embodiments, the set of conductive structures 324 may include conductive structures 324a and 324b. The conductive structures 324a may be dummy conductive structures or dummy pillars. The conductive structures 324b may be similar to the set of conductive structures 322. For example, a set of conductive wires may be electrically connected between the electronic component 13 and the carrier 30 and over the conductive structures 324b.

In some embodiments, a portion of the carrier 30 connected with the dummy conductive structures or dummy pillars (such as the conductive structures 324a and the set of conductive structures 323) may be a dummy region.

Figure 4C:
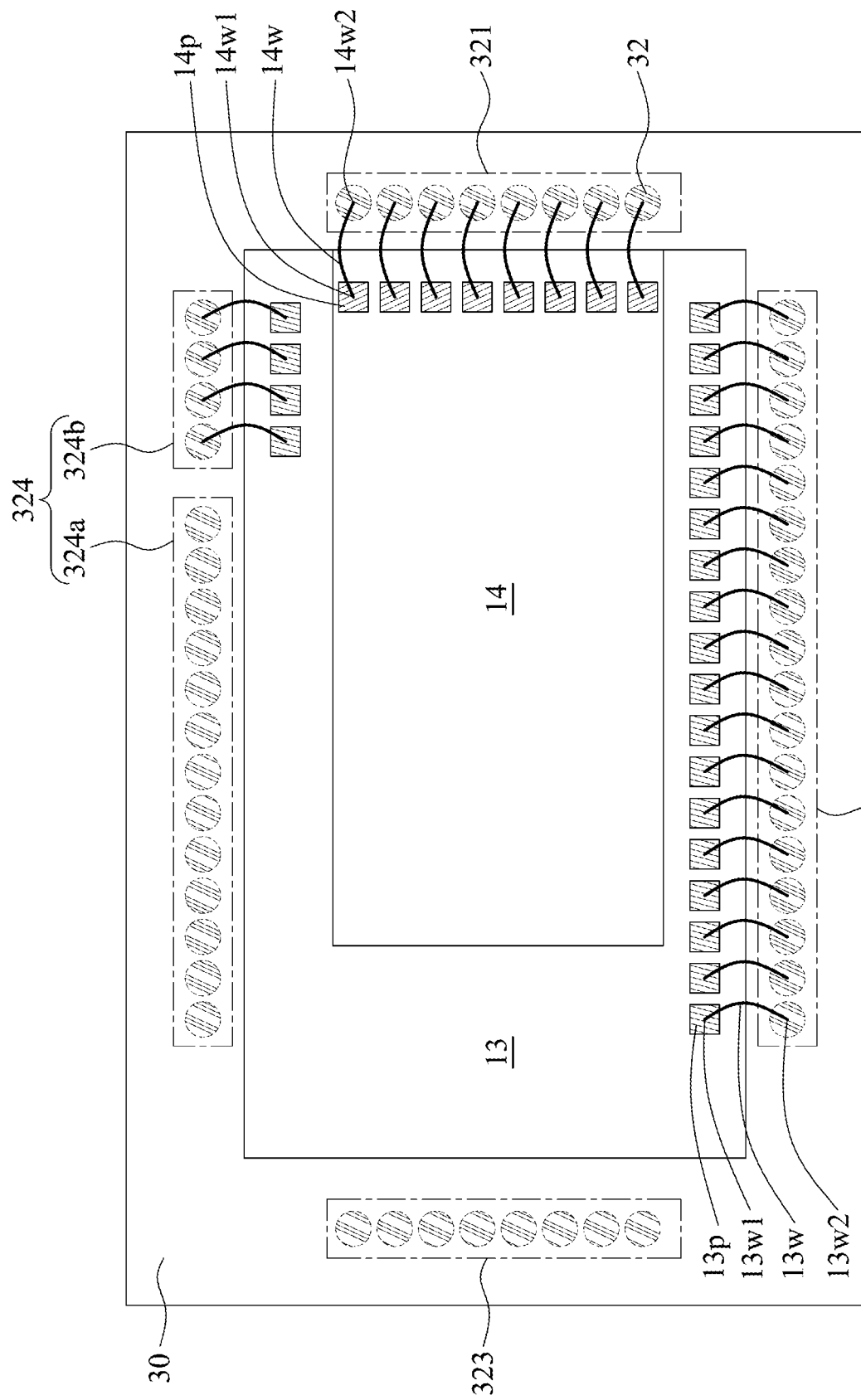
FIG. 4C illustrates a top view of a part of a semiconductor device package in accordance with some embodiments of the present disclosure.

FIG. 4C illustrates a top view of a part of a semiconductor device package in accordance with some embodiments of the present disclosure. In some embodiments, the top view in FIG. 4C may be a top view of the electronic components 13 and 14, and the conductive structures 32 of the semiconductor device package 3 in FIG. 3A. The carrier 30 and the carrier 10 are not illustrated in FIG. 4C for conciseness and clearness.

As shown in FIG. 4C, from a top view perspective or in a direction perpendicular to the carrier 30 and/or the carrier 10 (shown in FIG. 3A), the contact point 14w2 and the conductive structure 32 may be overlapping. Therefore, the contact points 14w2 on the corresponding conductive pads (i.e., on the conductive pads 30p the carrier 30) may be supported by the conductive structure 32 during a wire-bonding process. (e.g., during connecting the conductive wires 14w on the conductive pads 30p)

Similarly, from a top view perspective or in a direction perpendicular to the carrier 30 and/or the carrier 10 (shown in FIG. 3A), the contact point 13w2 and the conductive structure 32 may be overlapping.

Figure 4D:
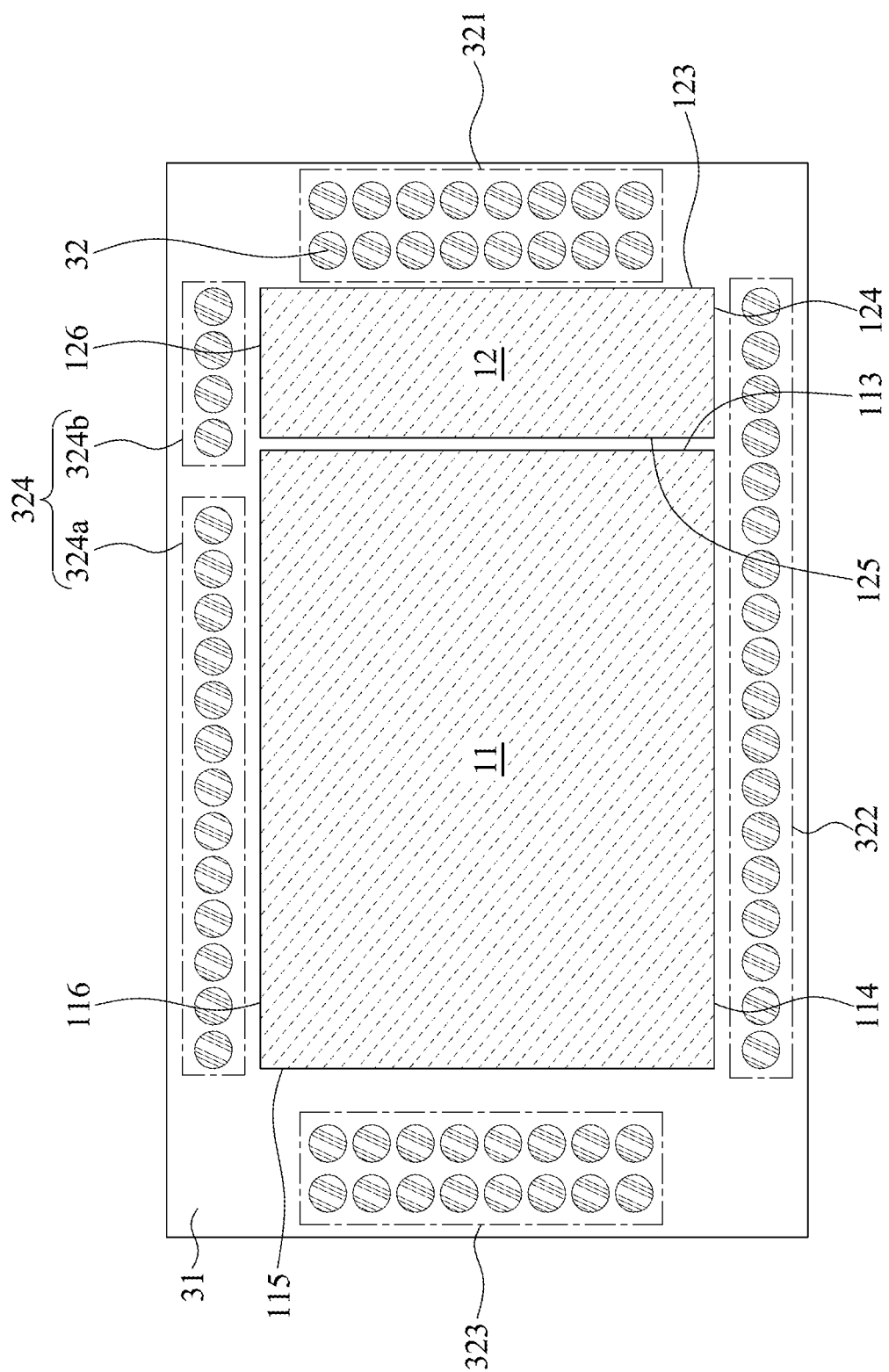
FIG. 4D illustrates a top view of a part of a semiconductor device package in accordance with some embodiments of the present disclosure.

FIG. 4D illustrates a top view of a part of a semiconductor device package in accordance with some embodiments of the present disclosure. The top view of FIG. 4D is similar to the top view of FIG. 4A, and the differences therebetween are described below.

There may be two rows of conductive structures in the set of conductive structures 321. In some embodiments, the row of the conductive structures 321 closer to the support structure 12 may be electrically connected with an electronic component (such as the electronic component 14 in FIG. 3A). The row of the conductive structures 321 farther from the support structure 1s may be dummy conductive structures or dummy pillars.

In some embodiments, the row of the conductive structures 321 closer to the support structure 12 may be dummy conductive structures or dummy pillars. The row of the conductive structures 321 farther from the support structure is may be electrically connected with an electronic component (such as the electronic component 14).

There may be two rows of conductive structures in the set of conductive structures 323. The two rows may be dummy conductive structures or dummy pillars.

There may be any number of the conductive structures in sets of conductive structures 321, 322, 323 and 423 depending on different design specifications.

FIG. 5A, FIG. 5B, FIG. 5C, FIG. 5D, FIG. 5E, FIG. 5F, FIG. 5G, FIG. 5H, and FIG. 5I illustrate perspective views in one or more stages of a method of manufacturing a semiconductor device package in accordance with an embodiment of the present disclosure. At least some of these figures have been simplified for a better understanding of the aspects of the present disclosure.

Figure 5A:
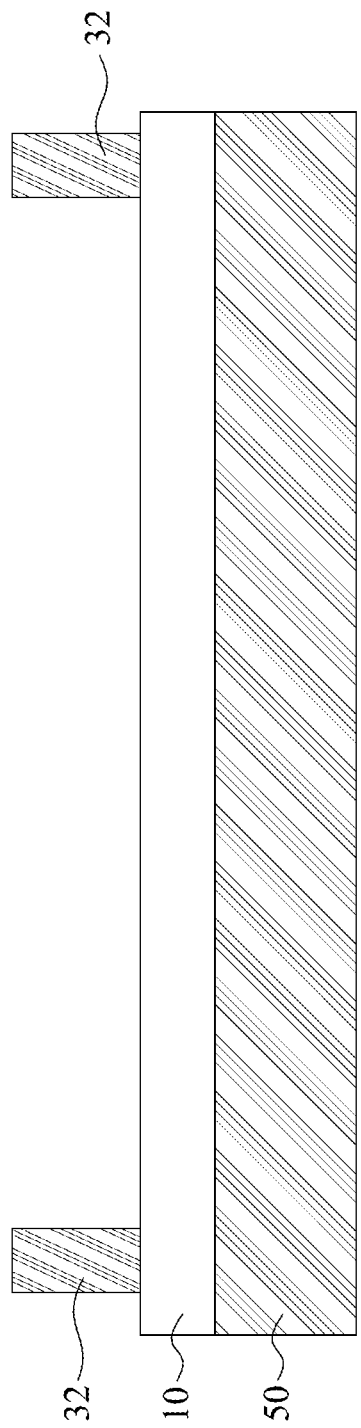
FIG. 5A, FIG. 5B, FIG. 5C, FIG. 5D, FIG. 5E, FIG. 5F, FIG. 5G, FIG. 5H, and FIG. 5I illustrate perspective views in one or more stages of a method of manufacturing a semiconductor device package in accordance with an embodiment of the present disclosure.

Referring to FIG. 5A, a temporary carrier 50 may be provided. The carrier 10 may be disposed on the temporary carrier 50. In some embodiments, the carrier 10 may be attached to the temporary carrier 50 through a dielectric layer (not shown in the figures). The conductive structures 32 may be formed on the carrier 10. In some embodiments, the conductive structures 32 may be formed by plating or wedge bonding.

Figure 5B:
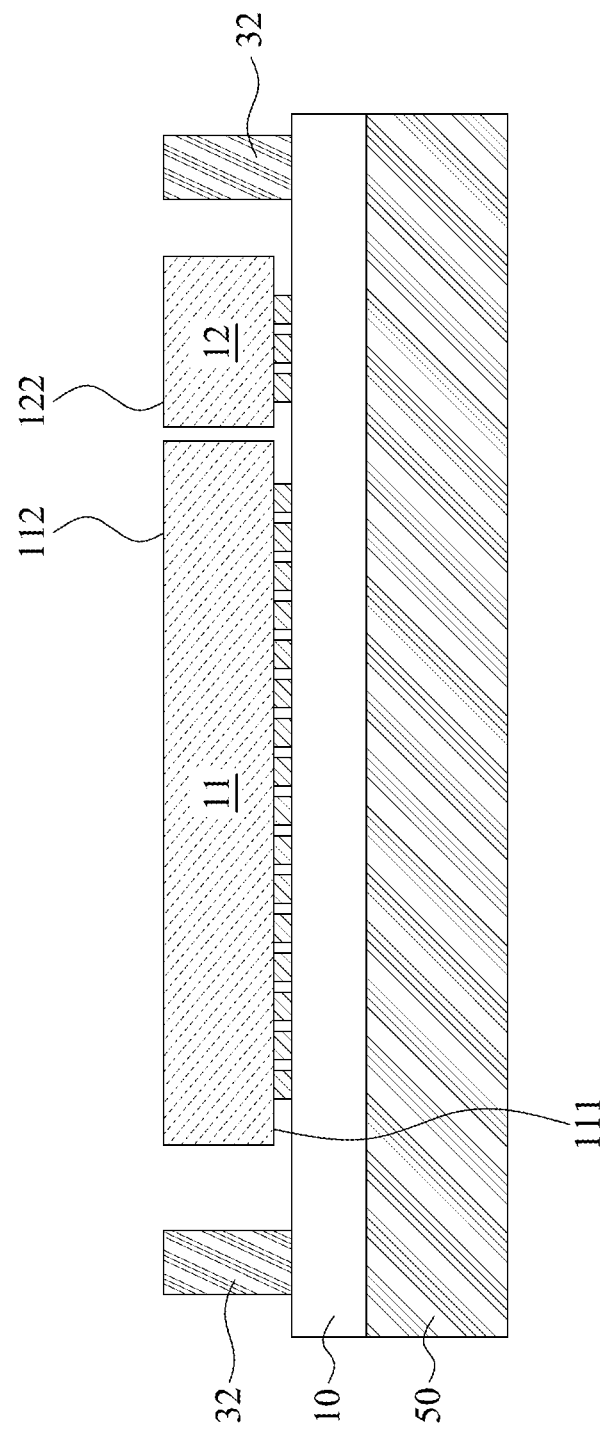

Referring to FIG. 5B, the electronic component 11 and the support structure 12 may be provided on the carrier 10 through a flip-chip technique or another suitable technique. In some embodiments, the conductive structures 32 may be disposed on the carrier 10 before the electronic component 11 and the support structure 12 are disposed. However, in some other embodiments, the conductive structures 32 may be disposed on the carrier 10 after the electronic component 11 and the support structure 12 are disposed.

Figure 5C:
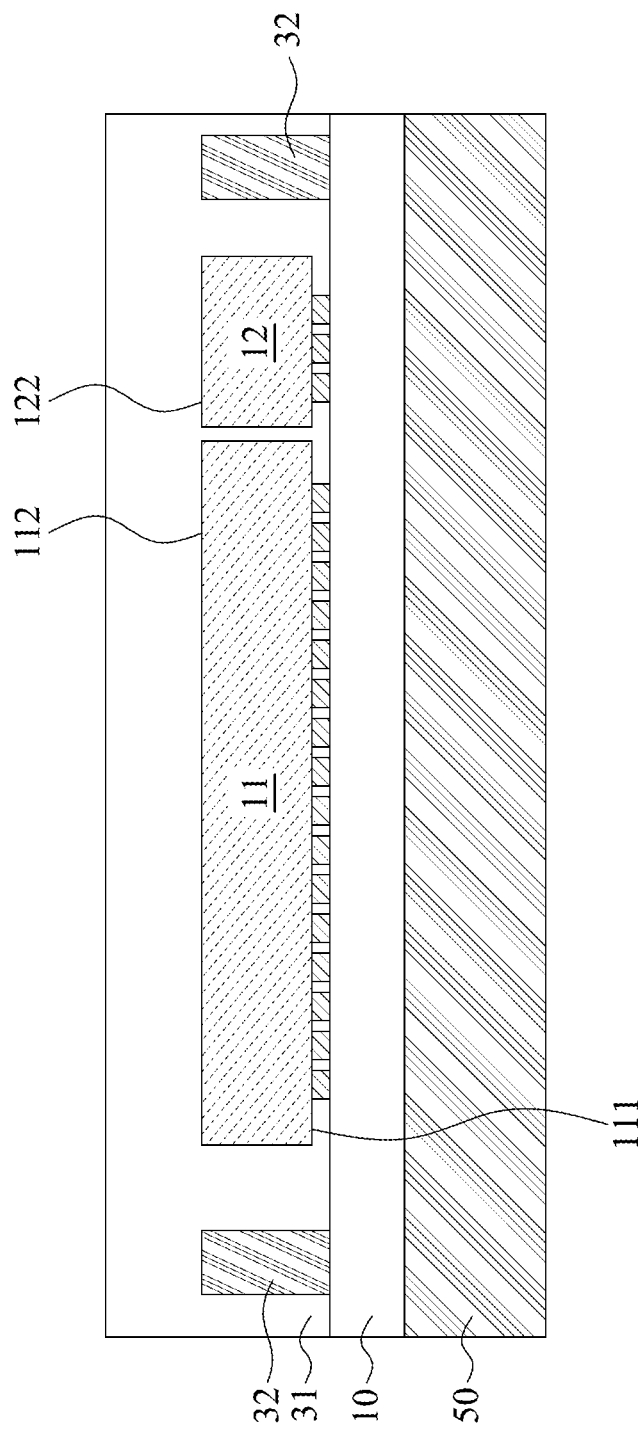

Referring to FIG. 5C, the encapsulant 31 may be disposed on the carrier 10 to cover and encapsulate the electronic component 11, the support structure 12 and the conductive structures 32. In some embodiments, the encapsulant 31 may be formed by a molding technique, such as transfer molding or compression molding.

Figure 5D:
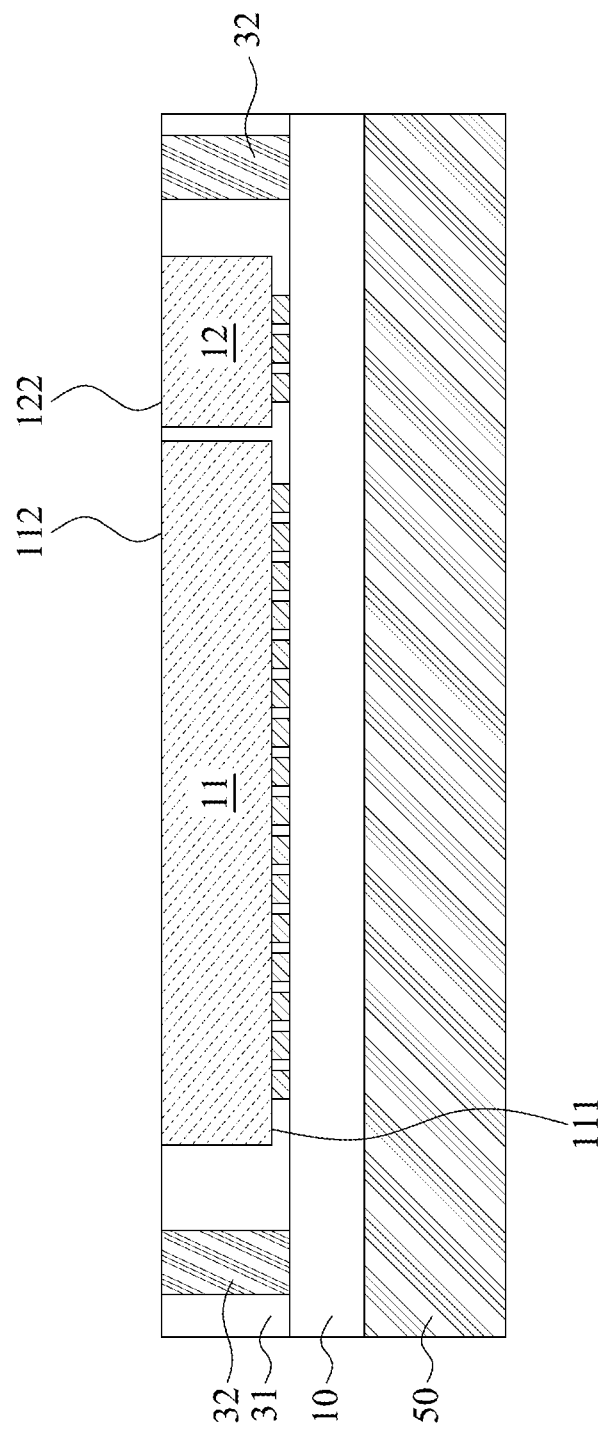

Referring to FIG. 5D, a planarization operation, a grinding operation, or another suitable removal operation may be applied to the encapsulant 31 to expose the conductive structures 32.

In some embodiments, the electronic component 11 is ground or thinned from the backside surface. Therefore, the surface 112 of the electronic component 11 and the surface 122 of the support structure 12 are exposed from the encapsulant 31. In some embodiments a roughness of the surface 112 may be different from a roughness of the other surfaces of the electronic component 11.

In some embodiments, the conductive structure 32 may be a tall pillar where a top surface thereof is higher than the surface 112 of the electronic component 11. Therefore, the surface 112 of the electronic component 11 may not be exposed from the encapsulant 31.

Figure 5E:
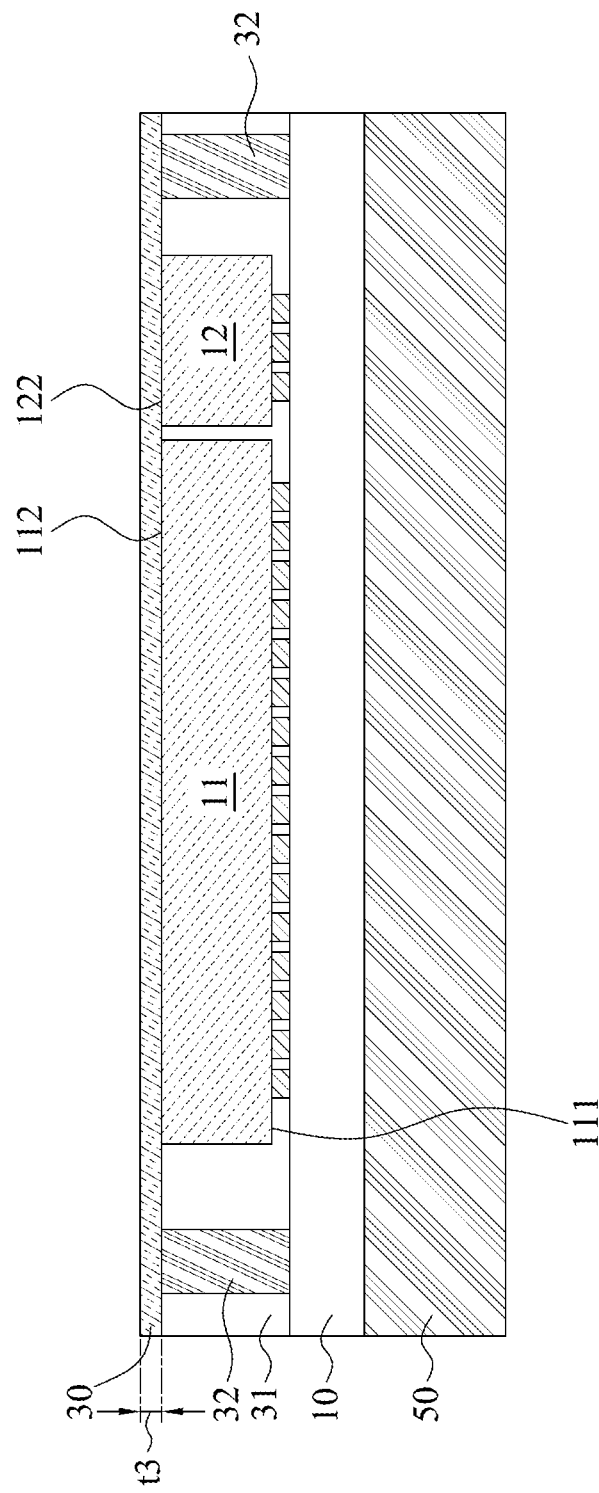

Referring to FIG. 5E, the carrier 30 may be disposed on the exposed portion of the conductive structures 32 and electrically connected with the carrier 10 through the conductive structures 32.

In some embodiments, as shown in FIG. 3B, a portion of the conductive layer in the carrier 30 over the electronic component 11 may be physically spaced apart from the electronic component 11 through the dielectric layer in the carrier 30. In some embodiments, as shown in FIG. 3C, a portion of the conductive layer in the carrier 30 over the support structure 12 may contact the support structure 12.

Figure 5F:
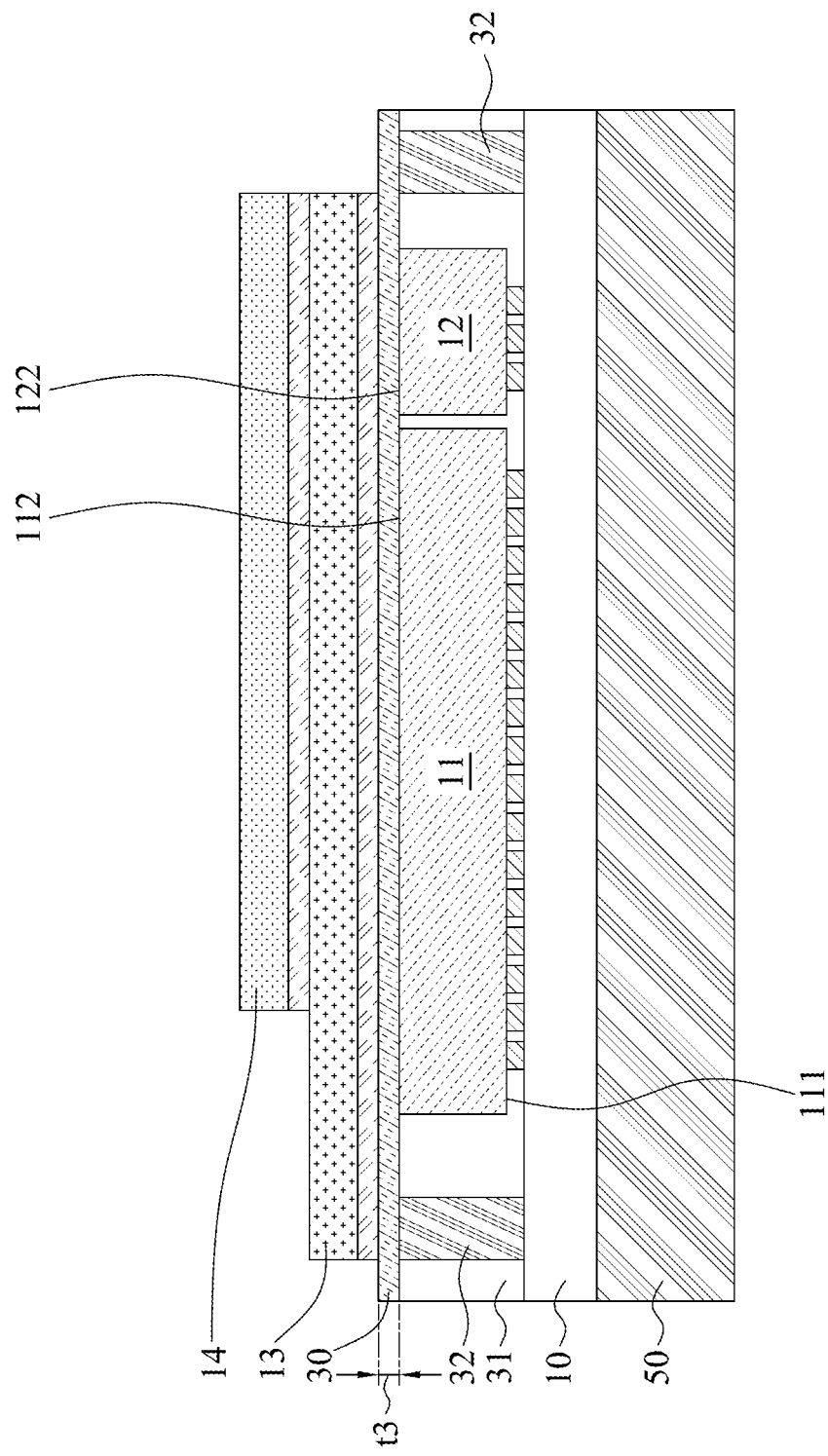

Referring to FIG. 5F, the electronic component 13 may be attached to the carrier 30 through the adhesive layer 13a and the electronic component 14 may be attached to the electronic component 13 through the adhesive layer 14a.

Figure 5G:
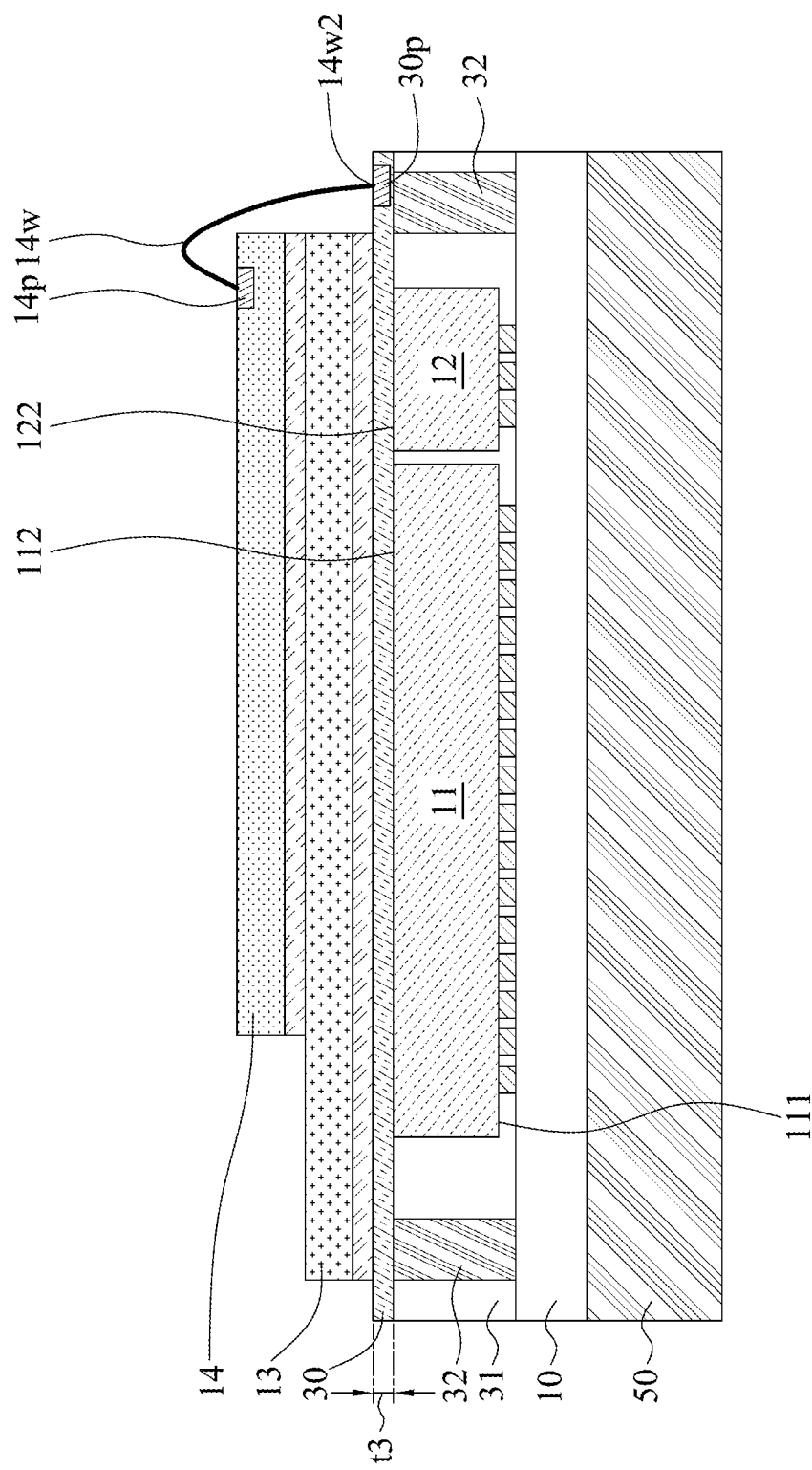

Referring to FIG. 5G, the electronic component 14 may be electrically connected with the carrier 30 by the conductive wires 14w through a wire-bonding process. The contact points 14w2 on the conductive pads 30p of the carrier 30 may be supported by the conductive structure 32 during a wire-bonding process. (e.g., during connecting the conductive wires 14w on the conductive pads 30p)

Similarly, the electronic component 13 may be electrically connected with the carrier 30 by the conductive wires 13w (as shown in FIG. 4B) through a wire-bonding process. The contact points 13w2 (as shown in FIG. 4B) on the conductive pads 30p the carrier 30 may be supported by the conductive structure 32 during a wire-bonding process. (e.g., during connecting the conductive wires 13w on the conductive pads 30p)

Figure 5H:
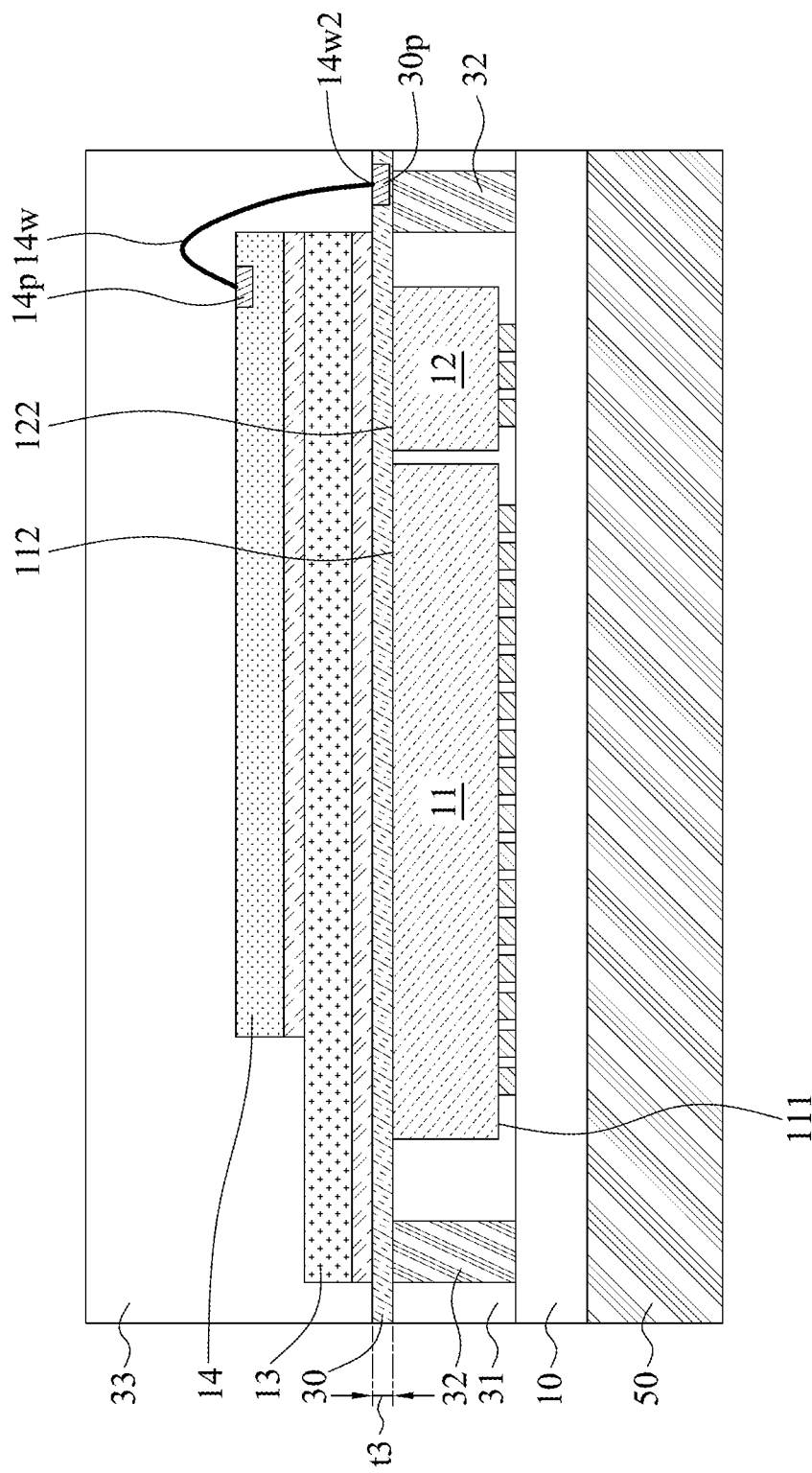

Referring to FIG. 5H, the encapsulant 33 may be disposed on the carrier 30 to cover and encapsulate the electronic component 13 and the electronic component 14. In some embodiments, the encapsulant 33 may be formed by a molding technique, such as transfer molding or compression molding.

Figure 5I:
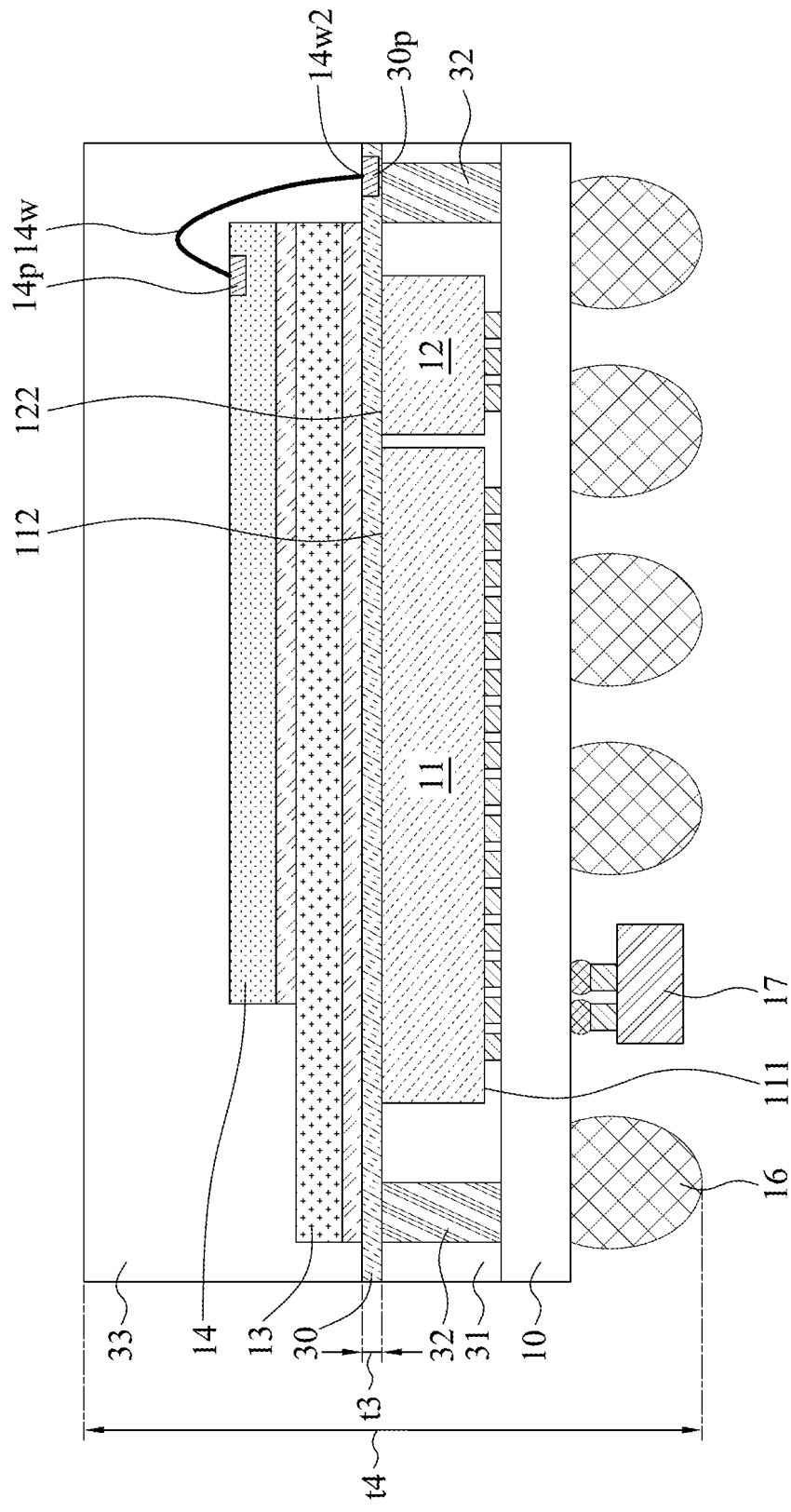

Referring to FIG. 5I, the temporary carrier 50 may be removed by an etching operation or other suitable processes. The electrical contacts 16 and the electronic component 17 may be provided on the exposed surface of the carrier 10.

The structure manufactured through the operations illustrated in FIG. 5A, FIG. 5B, FIG. 5C, FIG. 5D, FIG. 5E, FIG. 5F, FIG. 5G, FIG. 5H, and FIG. 5I may be similar to the semiconductor device package 3 in FIG. 3A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a carrier;
a first electronic component disposed on the carrier;

a support component disposed on the carrier;
a second electronic component disposed on the first electronic component and supported by the support component,
wherein the second electronic component comprises a first set of conductive pads, and the support component and at least one of the first set of conductive pads are overlapping; and
a third electronic component disposed on the second electronic component, wherein the first set of conductive pads are not covered by the third electronic component.

2. The semiconductor device package of claim 1, wherein the third electronic component comprises a second set of conductive pads, and the support component is overlapped by at least one of the second set of conductive pads vertically.

3. The semiconductor device package of claim 2, wherein the first set of conductive pads and the second set of conductive pads are arranged along edges of the support component from a top view.

4. The semiconductor device package of claim 1, wherein a lateral surface of the second electronic component and a lateral surface of the support component are substantially coplanar.

5. The semiconductor device package of claim 1, wherein the second electronic component has an active surface and a second surface opposite to the active surface, the active surface is farther from the carrier than the second surface.

6. The semiconductor device package of claim 1, wherein a roughness of a backside surface of the first electronic component is greater than a roughness of a lateral surface of the first electronic component.

7. A semiconductor device package, comprising:
a first carrier;
a first electronic component disposed on the first carrier;
a conductive structure disposed on the first carrier;
a second carrier in contact with the conductive structure; and
a second electronic component disposed on the second carrier; and
a first conductive element extending along a lateral side of second electronic component and electrically connects the second electronic component to the second carrier,
wherein the second carrier comprises a conductive layer and a dielectric layer covering the conductive layer and contacting the first electronic component, and wherein a first portion of the conductive layer over the first electronic component is physically spaced apart from the first electronic component by the dielectric layer.

8. The semiconductor device package of claim 7, further comprising:
a supporting component disposed between the first carrier and the second carrier, wherein a second portion of the conductive layer over the supporting component contacts the supporting component.

9. The semiconductor device package of claim 7, wherein an end of the first conductive element is over the conductive structure.

10. The semiconductor device package of claim 9, wherein a conductive layer in the second carrier electrically connects the end of the first conductive element to the conductive structure.

11. The semiconductor device package of claim 7, further comprising:
a supporting component disposed between the first carrier and the second carrier; and
a first set of conductive structures arranged along a first edge of the support component;
wherein one of the first set of conductive structures supports an end of the first conductive element.

12. The semiconductor device package of claim 11, further comprising:
a third electronic component disposed on the second electronic component; and
a second set of conductive structures arranged along a second edge of the support component substantially perpendicular to the first edge of the support component;
wherein one of the second set of conductive structures support an end of a second conductive element electrically connecting the third electronic component to the second carrier.

13. The semiconductor device package of claim 12, further comprising:
a third set of conductive structures arranged along a first edge of the first electronic component substantially parallel to the first edge of the support component;
wherein the third set of conductive structures are not electrically connected to the second carrier and is configured to balance a copper coverage of the second carrier and to alleviate warpage.

14. The semiconductor device package of claim 13, further comprising:
a fourth set of conductive structures arranged along a second edge of the first electronic component substantially parallel to the second edge of the support component;
wherein a part of the fourth set of conductive structures are not electrically connected with the second carrier and is configured to balance a copper coverage of the second carrier and to alleviate warpage.

15. A semiconductor device package, comprising:
a first electronic component;
a second electronic component disposed on the first electronic component;
a conductive wire having a first end electrically connecting the second electronic component and a second end electrically connecting the first electronic component;
a support component supporting the first end; and
a plurality of conductive structures disposed along at least two edges of the first electronic component, and wherein at least one of the plurality of conductive structures is disposed at least partially under the second end.

16. The semiconductor device package of claim 15, further comprising:
a carrier disposed between the first electronic component and the second electronic component;
wherein the second electronic component is attached to the carrier by an adhesive layer; and
wherein the conductive wire is electrically connected to at least one of the plurality of conductive structures by the carrier.

* * * * *